(12) United States Patent
Mou et al.

(10) Patent No.: US 11,770,913 B2
(45) Date of Patent: Sep. 26, 2023

(54) HEAT-DISSIPATING COMPONENT FOR MOBILE DEVICE

(71) Applicant: MICROJET TECHNOLOGY CO., LTD., Hsinchu (TW)

(72) Inventors: Hao-Jan Mou, Hsinchu (TW);
Ching-Sung Lin, Hsinchu (TW);
Chin-Chuan Wu, Hsinchu (TW);
Chih-Kai Chen, Hsinchu (TW);
Yung-Lung Han, Hsinchu (TW);
Chi-Feng Huang, Hsinchu (TW);
Wei-Ming Lee, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 303 days.

(21) Appl. No.: 17/083,599

(22) Filed: Oct. 29, 2020

(65) Prior Publication Data
US 2021/0144884 A1  May 13, 2021

(30) Foreign Application Priority Data

Nov. 8, 2019  (TW) .................................. 108140740

(51) Int. Cl.
*H05K 7/20* (2006.01)
*H05K 5/02* (2006.01)
(Continued)

(52) U.S. Cl.
CPC ....... *H05K 7/20154* (2013.01); *F04B 43/046* (2013.01); *F04B 45/047* (2013.01);
(Continued)

(58) Field of Classification Search
CPC .... F04B 43/046; F04B 45/047; F04B 39/121; F04B 39/123; F04B 45/04; F04B 45/041;
(Continued)

(56) References Cited

U.S. PATENT DOCUMENTS 5,354,032 A * 10/1994 Sims ..................... F16K 31/005
251/129.06
8,308,453 B2 * 11/2012 Yamamoto ............ F04B 43/046
417/560
(Continued)

FOREIGN PATENT DOCUMENTS

CN  111035373 A  *  4/2020
CN  111044674 A  *  4/2020
(Continued)

*Primary Examiner* — Jenna M Hopkins
(74) *Attorney, Agent, or Firm* — McClure, Qualey & Rodack, LLP

(57) ABSTRACT

A heat-dissipating component for a mobile device includes a case body, a micro pump, and a heat dissipation tube plate. The case body has a vent hole and a positioning accommodation trough. The bottom of the positioning accommodation trough is in communication with the vent hole. The micro pump is disposed in the positioning accommodation trough and corresponds to the vent hole The heat dissipation tube plate has cooling fluid inside. One end of the heat dissipation tube plate is fixed on the positioning accommodation trough and contacts a heating element of the mobile device. The gas transmitted by the micro pump forms gas flow so as to perform heat exchange with heat absorbed by the heat dissipation tube plate, and the gas flow is discharged out through the vent hole.

13 Claims, 29 Drawing Sheets

(51) Int. Cl.
  *H10N 30/20* (2023.01)
  *F04B 45/047* (2006.01)
  *F04B 43/04* (2006.01)

(52) U.S. Cl.
  CPC ....... *H05K 5/0213* (2013.01); *H05K 7/20272* (2013.01); *H10N 30/2047* (2023.02)

(58) Field of Classification Search
  CPC . F04B 45/045; F04B 35/045; H05K 7/20154; H05K 7/20163; H05K 7/20272; H05K 5/0213; F05B 2260/407; F05B 2260/60; F05B 39/1066; H10N 30/2047
  See application file for complete search history.

(56) References Cited

U.S. PATENT DOCUMENTS

| | | | | |
|---|---|---|---|---|
| 8,596,998 | B2* | 12/2013 | Fujisaki | F04B 45/047 92/96 |
| 9,028,226 | B2* | 5/2015 | Hirata | F04B 43/043 417/413.2 |
| 9,611,843 | B2* | 4/2017 | Hsueh | F04B 43/046 |
| 9,989,047 | B2* | 6/2018 | Chen | F04B 45/047 |
| 10,359,036 | B2 | 7/2019 | Chen et al. | |
| 10,371,136 | B2* | 8/2019 | Chen | F16K 99/0015 |
| 10,388,849 | B2* | 8/2019 | Chen | F04B 43/046 |
| 10,388,850 | B2* | 8/2019 | Chen | F16K 99/0015 |
| 10,451,051 | B2* | 10/2019 | Chen | F04B 53/10 |
| 10,487,821 | B2* | 11/2019 | Chen | F04B 53/10 |
| 10,529,911 | B2* | 1/2020 | Chen | F16K 99/0048 |
| 10,615,329 | B2* | 4/2020 | Chen | F16K 99/0015 |
| 10,644,221 | B2* | 5/2020 | Mou | F04B 17/003 |
| 10,655,620 | B2* | 5/2020 | Mou | F04B 45/047 |
| 10,678,298 | B2* | 6/2020 | Mou | H04R 1/025 |
| 10,683,861 | B2* | 6/2020 | Mou | F04B 53/1067 |
| 10,773,274 | B2* | 9/2020 | Mou | B05B 17/0653 |
| 10,788,028 | B2* | 9/2020 | Chen | F04B 17/003 |
| 10,801,488 | B2* | 10/2020 | Mou | F04B 39/121 |
| 11,067,073 | B2* | 7/2021 | Chen | F04B 43/046 |
| 11,162,488 | B2* | 11/2021 | Mou | F04B 45/047 |
| 11,454,232 | B2* | 9/2022 | Mou | F04B 43/046 |
| 11,456,234 | B2* | 9/2022 | Ganti | F04B 17/003 |
| 11,460,022 | B2* | 10/2022 | Mou | F04B 53/20 |
| 2002/0186860 | A1* | 12/2002 | Ogura | H04R 17/00 381/190 |
| 2005/0072559 | A1* | 4/2005 | Ippoushi | H05K 7/20272 165/104.33 |
| 2006/0159295 | A1* | 7/2006 | Onishi | H04R 17/00 381/190 |
| 2009/0232683 | A1* | 9/2009 | Hirata | F04B 45/047 417/413.2 |
| 2011/0076170 | A1* | 3/2011 | Fujisaki | F04B 45/047 417/415 |
| 2012/0171062 | A1* | 7/2012 | Kodama | F04B 45/047 417/413.2 |
| 2013/0058818 | A1* | 3/2013 | Hirata | F04B 45/047 417/479 |
| 2013/0071269 | A1* | 3/2013 | Fujisaki | F04B 43/046 417/413.2 |
| 2013/0323085 | A1* | 12/2013 | Hirata | F04B 43/046 417/413.1 |
| 2014/0178220 | A1* | 6/2014 | Fujisaki | F04B 45/047 417/413.2 |
| 2014/0377099 | A1* | 12/2014 | Hsueh | F04B 49/22 417/413.2 |
| 2015/0071797 | A1* | 3/2015 | Takeuchi | F04B 43/0054 417/413.2 |
| 2015/0150470 | A1* | 6/2015 | Sano | A61B 5/0225 600/490 |
| 2015/0219608 | A1* | 8/2015 | Choi | G01N 33/0009 73/23.2 |
| 2015/0245536 | A1* | 8/2015 | Li | F04B 45/047 361/697 |
| 2016/0076530 | A1* | 3/2016 | Chen | F04B 45/047 417/413.2 |
| 2016/0348666 | A1* | 12/2016 | Tanaka | F04B 45/047 |
| 2018/0066762 | A1* | 3/2018 | Han | F16K 31/02 |
| 2018/0066768 | A1* | 3/2018 | Han | H02N 2/001 |
| 2018/0128262 | A1* | 5/2018 | Mou | F04B 53/10 |
| 2018/0223829 | A1* | 8/2018 | Tanaka | F04B 45/047 |
| 2019/0060943 | A1* | 2/2019 | Mou | B05B 17/0607 |
| 2019/0277573 | A1 | 9/2019 | Engelhardt et al. | |
| 2020/0053905 | A1* | 2/2020 | Ganti | H01L 23/473 |
| 2021/0144884 | A1* | 5/2021 | Mou | H10N 30/2047 |
| 2021/0176895 | A1* | 6/2021 | Mukundan | H05K 7/20254 |
| 2021/0180723 | A1* | 6/2021 | Mukundan | H05K 7/20172 |
| 2021/0185853 | A1* | 6/2021 | Ganti | G06F 1/206 |
| 2022/0087064 | A1* | 3/2022 | Ganti | F04B 45/047 |
| 2022/0110220 | A1* | 4/2022 | Yalamarthy | G06F 1/203 |
| 2022/0189852 | A1* | 6/2022 | Sathyamurthy | F04D 33/00 |
| 2022/0282932 | A1* | 9/2022 | Sathyamurthy | F28D 9/0081 |
| 2023/0011084 | A1* | 1/2023 | Mukundan | H05K 7/20272 |
| 2023/0016991 | A1* | 1/2023 | Mukundan | H05K 7/20272 |

FOREIGN PATENT DOCUMENTS

| | | | |
|---|---|---|---|
| CN | 111044676 A | * | 4/2020 |
| CN | 111044677 A | * | 4/2020 |
| CN | 210775142 U | * | 6/2020 |
| CN | 211831598 U | * | 10/2020 |
| TW | I259053 B | | 7/2006 |
| TW | 201819766 A | | 6/2018 |
| TW | I641310 B | | 11/2018 |
| TW | 201903285 A | | 1/2019 |
| TW | M574151 U | | 2/2019 |
| TW | 202014117 A | * | 4/2020 |
| TW | 202014143 A | * | 4/2020 |
| TW | 202014979 A | * | 4/2020 |
| TW | I722935 B | * | 3/2021 |
| TW | I735044 B | * | 4/2021 |
| WO | WO-2017061349 A1 | * | 4/2017 |
| WO | WO-2022060594 A1 | * | 3/2022 |

* cited by examiner ial pump according to a variation implementation of the
HEAT-DISSIPATING COMPONENT FOR MOBILE DEVICE

CROSS-REFERENCE TO RELATED APPLICATION

This non-provisional application claims priority under 35 U.S.C. § 119(a) to Patent Application No. 108140740 filed in Taiwan, R.O.C. on Nov. 8, 2019, the entire contents of which are hereby incorporated by reference.

BACKGROUND

Technical Field

The present disclosure relates to a heat-dissipating component for a mobile device. In particular, to an ultra-thin liquid heat-dissipating module used to combine with a portable electronic device or a mobile device.

Related Art

With the rapid developments of smart phones in recent years, their specifications, equipment, and functions have been rapidly upgraded. In order to meet the requirements, the computing performance of the processing chips in the smart phones has been improved as well. However, if the heat generated by the processing chip during its high-speed operation process cannot be quickly removed, it will greatly affect its performance. Particularly, the devices related to 5G high-speed transmission technology that currently being developed in various countries need fast heat dissipation function inside more eagerly. In view of this, how to provide a heat dissipation module for a mobile device to achieve quick heat dissipation is a problem that needs to be solved at present.

SUMMARY

One object of the present disclosure is providing a liquid heat-dissipating module, which can be disposed in a portable electronic device to improve the heat-dissipating effect.

To achieve the above mentioned purpose(s), a general embodiment of the present disclosure provides a heat-dissipating component for a mobile device. The heat-dissipating component includes a case body, a micro pump, and a heat dissipation tube plate. The case body has a vent hole and a positioning accommodation trough, the positioning accommodation trough corresponds to the vent hole, and a bottom of the positioning accommodation trough is in communication with the vent hole. The micro pump is disposed in the positioning accommodation trough and corresponds to the vent hole in communication with the bottom of the positioning accommodation trough. The gas transmitted by the micro pump can be discharged out through the vent hole during operation. The heat dissipation tube plate has cooling fluid inside, wherein one end of the heat dissipation tube plate is fixed on the positioning accommodation trough and contacts a heating element of the mobile device so as to perform liquid convective heat exchange with heat generated by the heating element. The gas transmitted by the micro pump forms gas flow so as to perform heat exchange with heat absorbed by the heat dissipation tube plate, and the gas flow is discharged out through the vent hole.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
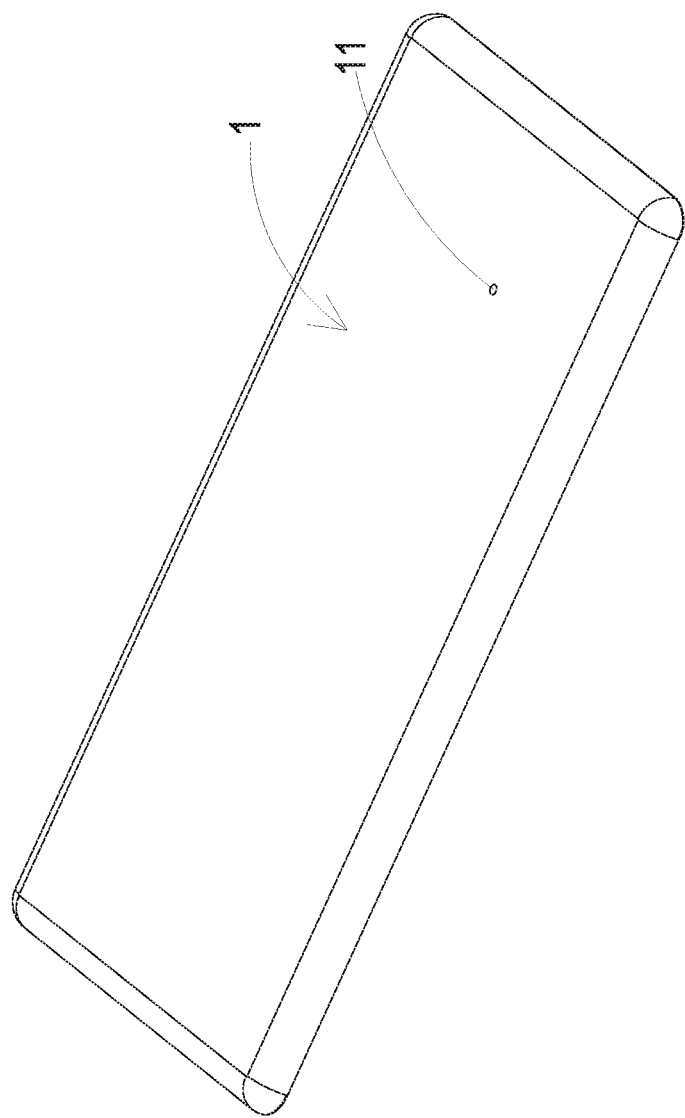
FIG. 1 illustrates a schematic front perspective view of a heat-dissipating component for a mobile device according to an exemplary embodiment of the present disclosure.
Figure 2:
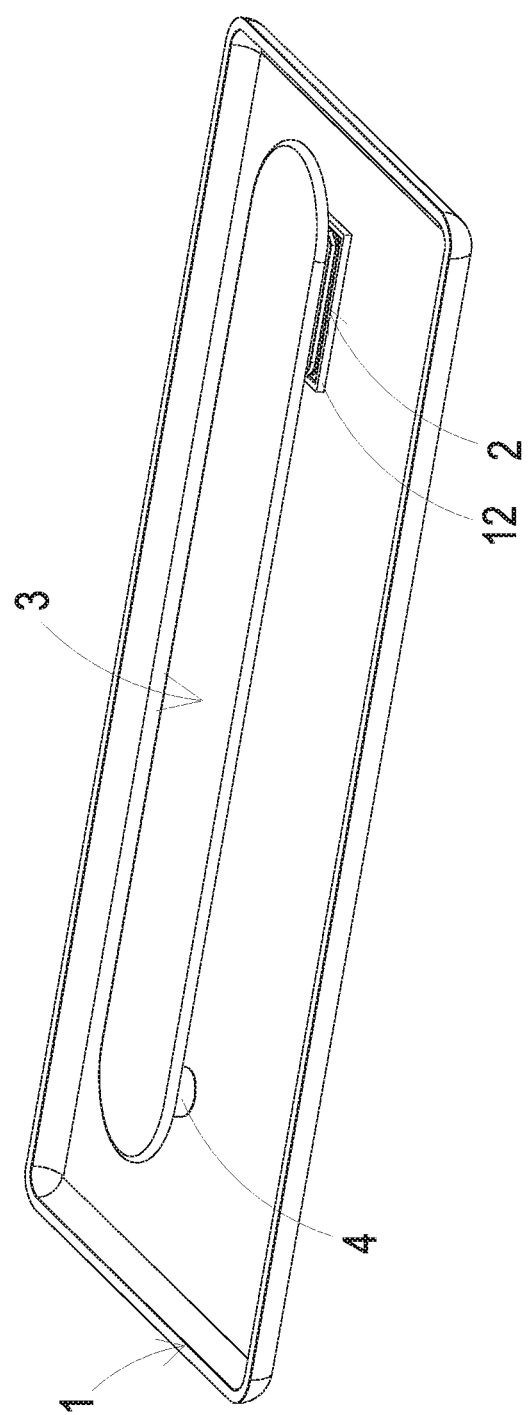
FIG. 2 illustrates a schematic rear perspective view of the heat-dissipating component for a mobile device according to the exemplary embodiment of the present disclosure.
Figure 3:
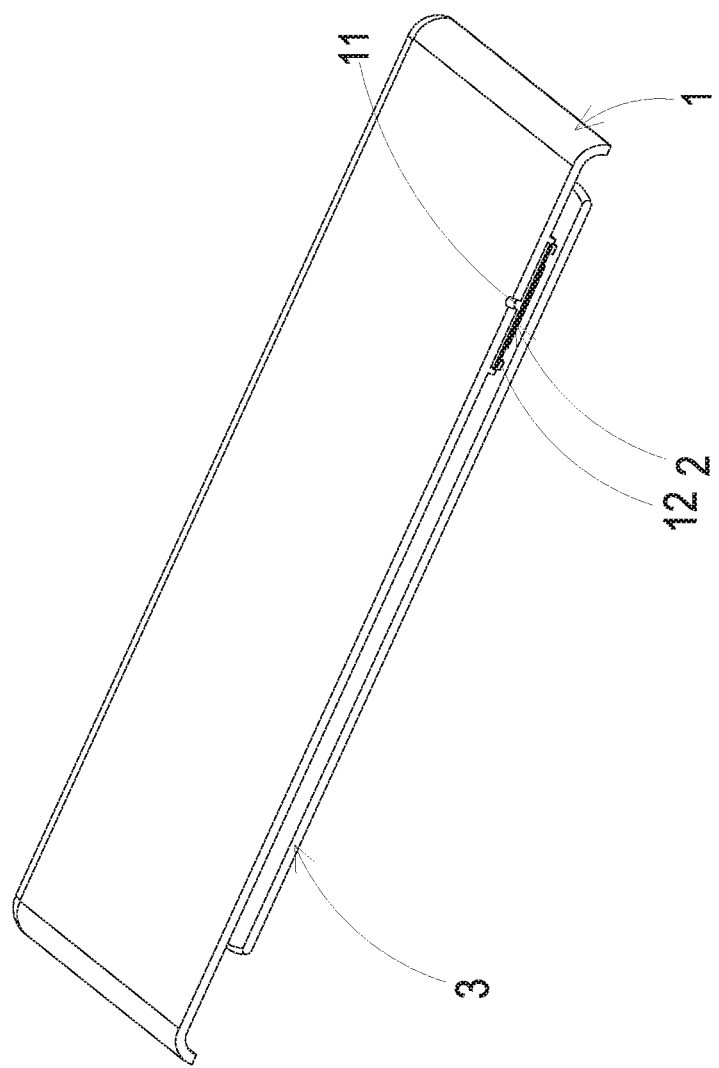
FIG. 3 illustrates a schematic perspective sectional view of the heat-dissipating component for a mobile device according to the exemplary embodiment of the present disclosure.

The present disclosure will now be described more specifically with reference to the following embodiments. It is to be noted that the following descriptions of different embodiments of this disclosure are presented herein for purpose of illustration and description only, and it is not intended to limit the scope of the present disclosure.

Please refer to FIG. 1 to FIG. 4. The present disclosure provides a heat-dissipating component for a mobile device. The heat-dissipating component includes a case body 1, a micro pump 2, and a heat dissipation tube plate 3. The case body 1 has a vent hole 11 and a positioning accommodation trough 12. The positioning accommodation trough 12 is disposed in the case body 1, and the positioning accommodation trough 12 corresponds to the vent hole 11 and is in communication with the vent hole 11. The positioning accommodation trough 12 is in communication with outside of the case body 1 through the vent hole 11. The micro pump 2 is disposed in the positioning accommodation trough 12 and corresponds to the vent hole 11. When the micro pump 2 starts to operate, the transmitted gas is discharged out through the vent hole 11. The heat dissipation tube plate 3 is disposed in the case body 1 and has cooling fluid inside. One end of the heat dissipation tube plate 3 is fixed on the positioning accommodation trough 12 and contacts a heating element 5 of the mobile device so as to perform liquid convective heat exchange with heat generated by the heating element 5. The cooling fluid flows in the heat dissipation tube plate 3, so that the heat can be dissipated evenly. Then, the gas transmitted by the micro pump 2 forms gas flow so as to perform heat exchange with heat absorbed by the heat dissipation tube plate 3, and eventually the gas flow is discharged out through the vent hole 11.

Please refer to FIG. 5A to FIG. 6A, the micro pump 2 in the first embodiment of the present disclosure is a micro blower pump. The micro blower pump includes a nozzle plate 21, a chamber frame 22, an actuating body 23, an insulation frame 24, and a conductive frame 25. The nozzle plate 21 is made of a flexible material, and the nozzle plate 21 has a suspension sheet 210, a hollow hole 211, and a plurality of connecting elements 212. The suspension sheet 210 is a flexible sheet, which can bend and vibrate. The shape of the suspension sheet 210 may be square, circle, ellipse, triangle, or polygon. The hollow hole 211 penetrates the center portion of the suspension sheet 210 for allowing the gas flowing therethrough. In this embodiment, the number of the connecting elements 212 is four, and the nozzle plate 21 is fixed in the positioning accommodation trough 12 through the connecting elements 212. The chamber frame 22 is stacked on the nozzle plate 21, and the shape of the chamber frame 22 corresponds to the shape of the nozzle plate 21. The actuating body 23 is stacked on the chamber frame 22. A resonance chamber 26 is defined among the actuating body 23, the chamber frame 22 and the suspension sheet 210. The insulation frame 24 is stacked on the actuating body 23. The appearance of the insulation frame 24 is similar to that of the chamber frame 22. The conductive frame 25 is stacked on the insulation frame 24. The appearance of the conductive frame 25 is similar to that of the insulation frame 24. The conductive frame 25 has a conductive frame pin 251 and a conductive electrode 252. The conductive frame pin 251 extends outwardly from the outer edge of the conductive frame 25, and the conductive electrode 252 extends inwardly from the inner edge of the conductive frame 25. Moreover, the actuating body 23 further includes a piezoelectric carrier plate 231, an adjusting resonance plate 232, and a piezoelectric plate 233. The piezoelectric carrier plate 231 is stacked on the chamber frame 22. The adjusting resonance plate 232 is stacked on the piezoelectric carrier plate 231. The piezoelectric plate 233 is stacked on the adjusting resonance plate 232. The adjusting resonance plate 232 and the piezoelectric plate 233 are accommodated in the insulation frame 24. The conductive electrode 252 of the conductive frame 25 is electrically connected to the piezoelectric plate 233. The piezoelectric carrier plate 231 and the adjusting resonance plate 232 are both made of the same conductive material or different conductive materials. The piezoelectric carrier plate 231 has a piezoelectric pin 2311. The piezoelectric pin 2311 and the conductive frame pin 251 are used for electrical connection so as to receive a driving signal (a driving frequency and a driving voltage). The piezoelectric pin 2311, the piezoelectric carrier plate 231, the adjusting resonance plate 232, the piezoelectric plate 233, the conductive electrode 252, the conductive frame 25, and the conductive frame pin 251 may together form a loop, and the insulation frame 24 is provided for electrically isolating the conductive frame 25 from the actuating body 23 for avoiding short circuit, whereby the driving signal can be transmitted to the piezoelectric plate 233. When the piezoelectric plate 233 receives the driving signal (a driving frequency and a driving voltage), the piezoelectric plate 233 deforms owing to the piezoelectric effect, and thus the piezoelectric carrier plate 231 and the adjusting resonance plate 232 are driven to perform reciprocating vibration correspondingly.

As mentioned above, the adjusting resonance plate 232 is disposed between the piezoelectric plate 233 and the piezoelectric carrier plate 231. As a result, the adjusting resonance plate 232 can be served as a buffering element between the piezoelectric plate 233 and the piezoelectric carrier plate 231, whereby the vibration frequency of the piezoelectric carrier plate 231 can be adjusted. Generally, the thickness of the adjusting resonance plate 232 is greater than the thickness of the piezoelectric carrier plate 231. The thickness of the adjusting resonance plate 232 may be changed so as to adjust the vibration frequency of the actuating body 23.

A plurality of gaps 213 is defined among the connecting elements 212, the suspension sheet 210, and the inner edge of the positioning accommodation trough 12 for allowing the gas flowing therethrough. Please still refer to FIG. 6A. The nozzle plate 21, the chamber frame 22, the actuating body 23, the insulation frame 24, and the conductive frame 25 are sequentially stacked and assembled with each other in the positioning accommodation trough 12. A gas flow chamber 27 is formed between the nozzle plate 21 and the bottom surface (not labelled) of the positioning accommodation trough 12. The gas flow chamber 27 is in communication with, through the hollow hole 211 of the nozzle plate 21, the resonance chamber 26 among the actuating body 23, the chamber frame 22, and the suspension sheet 210. By controlling the vibration frequency of the gas in the resonance chamber 26 to be the same as the vibration frequency of the suspension sheet 210, the resonance chamber 26 and suspension sheet 210 can perform the Helmholtz resonance effect so as to improve the transmission efficiency of the gas.

Figure 6A:
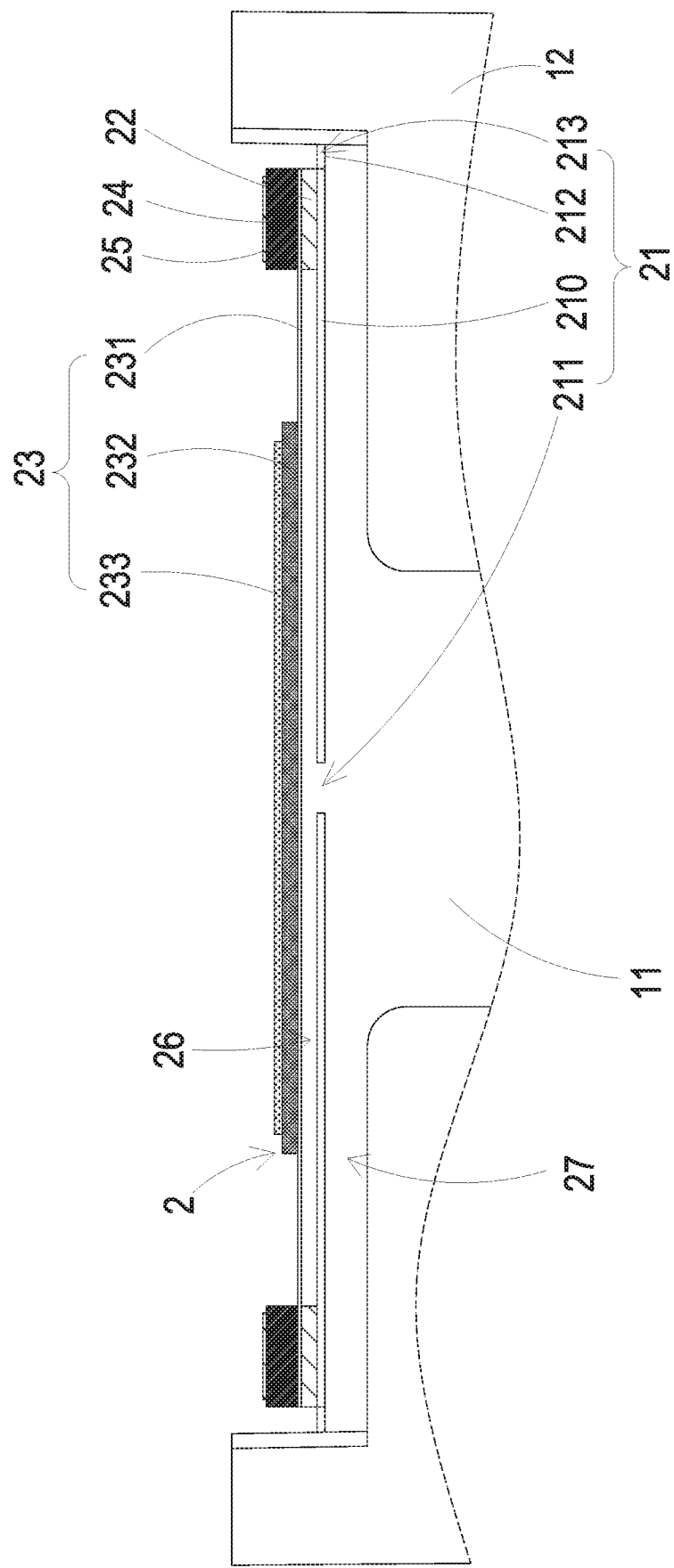
FIG. 6A illustrates a schematic cross-sectional view of the micro pump according to the first embodiment of the present disclosure.
Figure 6B:
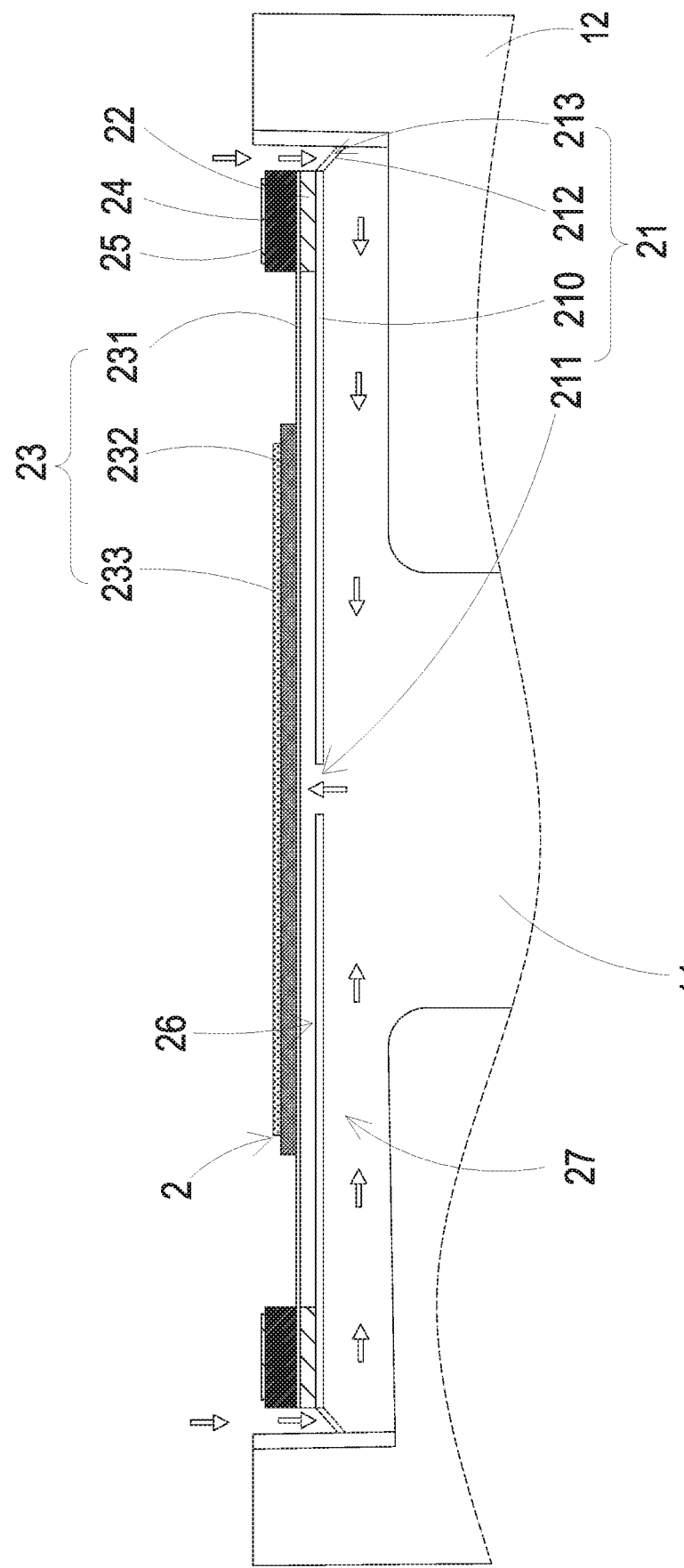
FIG. 6B and FIG. 6C illustrate schematic cross-sectional views showing the micro pump according to the first embodiment of the present disclosure at different operation steps.
Figure 6C:
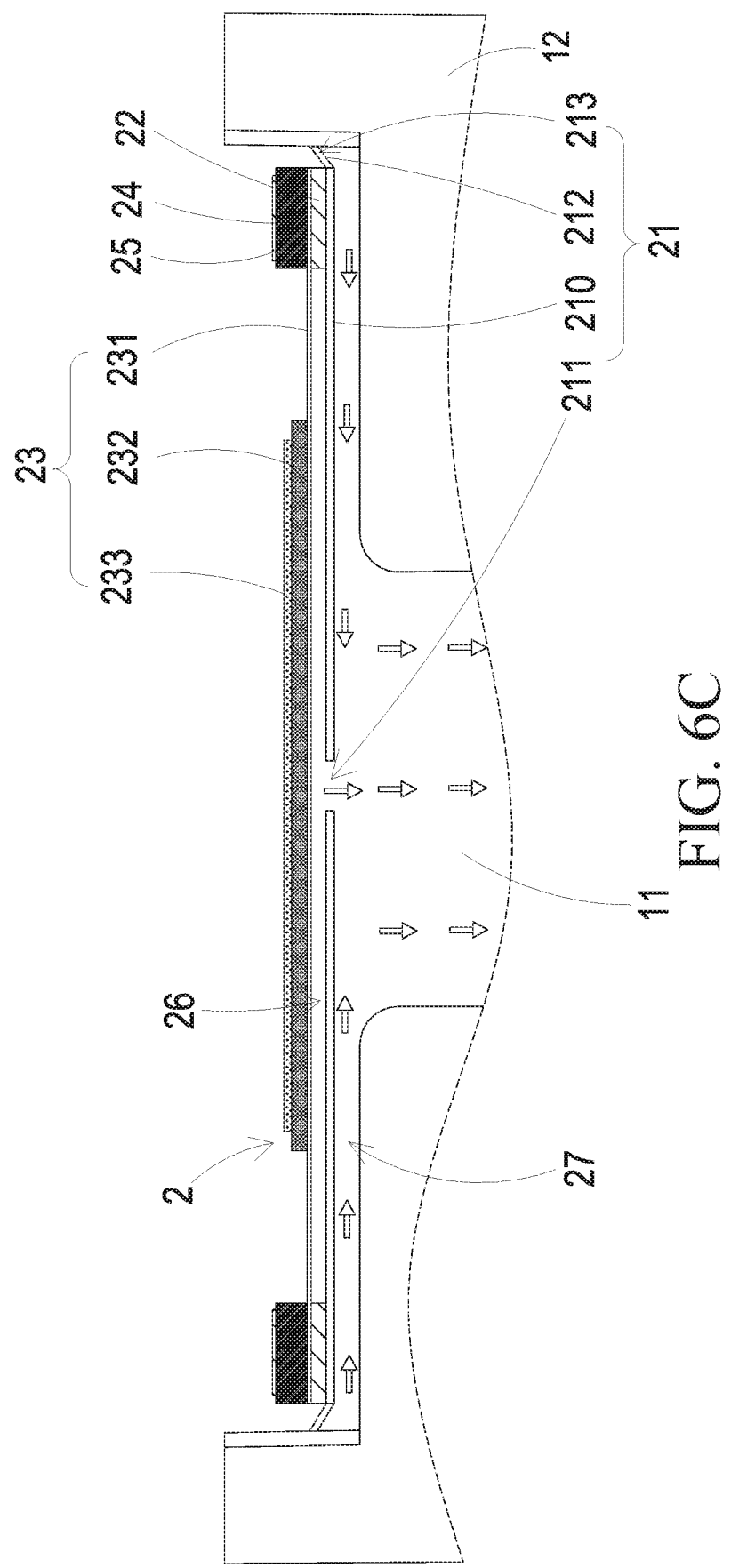
Figure 7A:
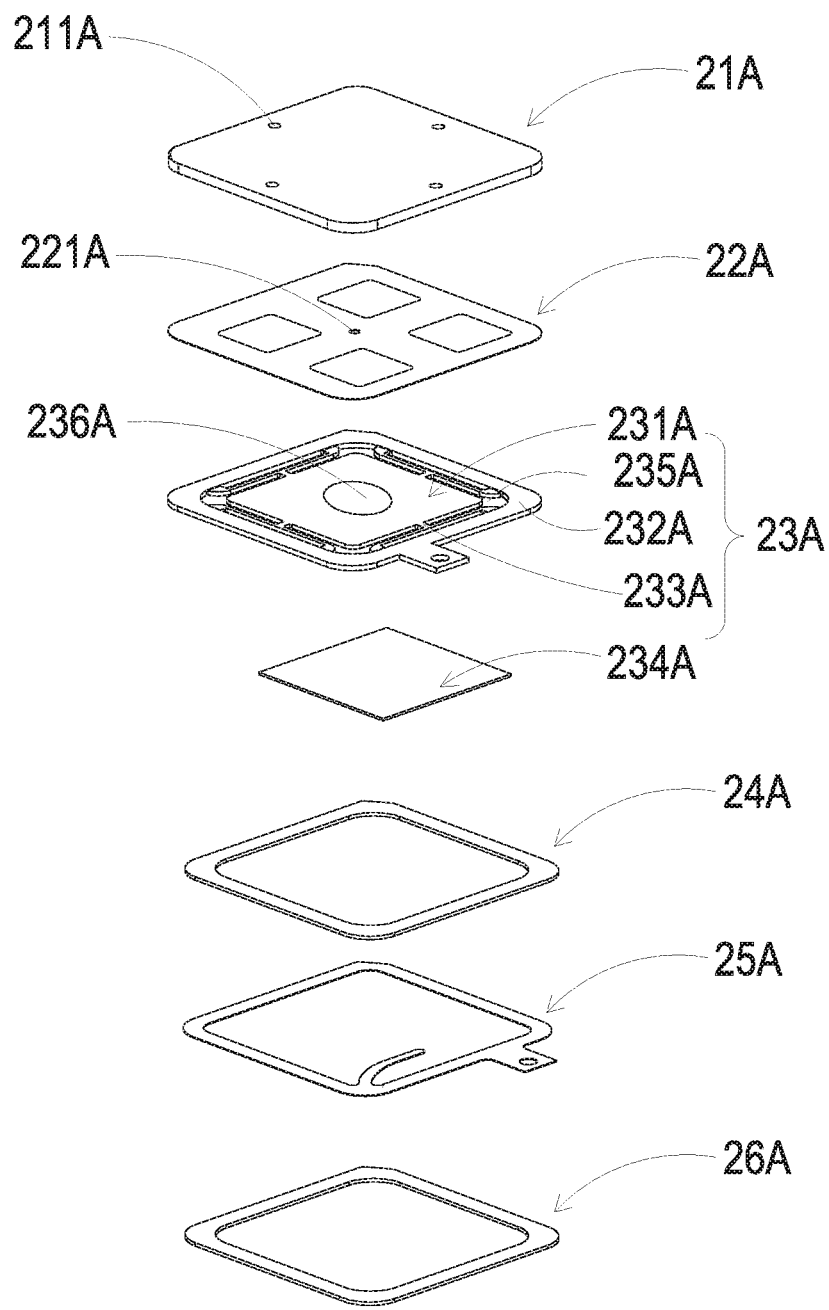
FIG. 7A illustrates a schematic front exploded view of a micro pump according to a second embodiment of the present disclosure.
Figure 7B:
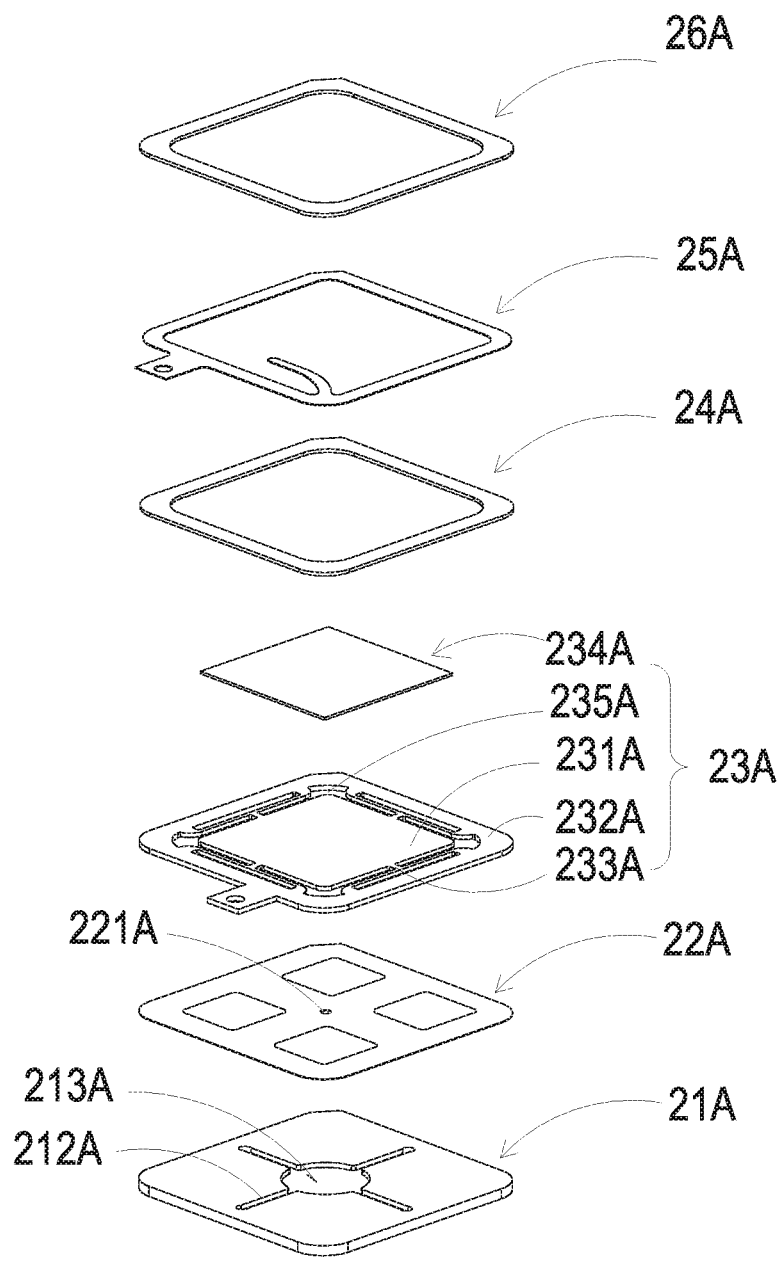
FIG. 7B illustrates a schematic rear exploded view of the micro pump according to the second embodiment of the present disclosure.

FIG. 6B and FIG. 6C illustrate schematic cross-sectional views showing the micro pump of FIG. 6A at different operation steps. Please refer to FIG. 6B first. When the piezoelectric plate 233 bends toward a direction away from the bottom surface of the positioning accommodation trough 12, the suspension sheet 210 of the nozzle plate 21 is driven to bend toward the direction away from the bottom surface of the positioning accommodation trough 12 correspondingly. Hence, the volume of the gas flow chamber 27 expands quickly, so that the internal pressure of the gas flow chamber 27 decreases and becomes negative, thereby drawing the gas outside the micro pump 2 to flow into the micro pump 2 through the gaps 213. The gas further enters into the resonance chamber 26 through the hollow hole 211, thereby increasing the gas pressure of the resonance chamber 26 and thus generating a pressure gradient. As shown in FIG. 6C, when the piezoelectric plate 233 drives the suspension sheet 210 of the nozzle plate 21 to move toward the bottom surface of the positioning accommodation trough 12, the gas inside the resonance chamber 26 is pushed to flow out quickly through the hollow hole 211 so as to further push the gas inside the gas flow chamber 27, whereby the converged gas can be quickly and massively ejected in a state closing to an ideal gas state under the Bernoulli's law. Further, after the gas is discharged out of the resonance chamber 26, the internal pressure of the resonance chamber 26 is lower than the equilibrium pressure due to the inertia, thereby the pressure difference guiding the gas outside the resonance chamber 26 into the resonance chamber 26 again. Therefore, by repeating the steps as shown in FIG. 6B and FIG. 6C, the piezoelectric plate 233 can bend and vibrate reciprocatingly. Moreover, by controlling the vibration frequency of the gas inside the resonance chamber 26 to be the same as the vibration frequency of the piezoelectric plate 233 in such way to perform the Helmholtz resonance effect, high-speed and large-volume gas transmission can be achieved.

Please refer to FIG. 7A to FIG. 8A, the micro pump 2 in the second embodiment of the present disclosure is a microelectromechanical systems (MEMS) pump. The micro pump 2 includes an inlet plate 21A, a resonance sheet 22A, a piezoelectric actuator 23A, a first insulation sheet 24A, a conductive sheet 25A, and a second insulation sheet 26A. The piezoelectric actuator 23A is disposed correspondingly to the resonance sheet 22A. The inlet plate 21A, the resonance sheet 22A, the piezoelectric actuator 23A, the first insulation sheet 24A, the conductive sheet 25A, and the second insulation sheet 26A are sequentially stacked and assembled with each other.

The inlet plate 21A has at least one inlet hole 211A, at least one convergence trough 212A, and a convergence chamber 213A. In this embodiment, the number of the inlet holes 211A is preferably four, but not limited thereto. The inlet hole 211A penetrates the inlet plate 21A, so that the gas outside the micro pump 2 can flow into the micro pump 2 from the inlet hole 211A due to the atmospheric pressure gradient. The inlet plate 21A has the at least one convergence trough 212A, and the number and the position of the convergence trough 212A correspond to that of the inlet hole 211A on the opposite side of the inlet plate 21A. In the present embodiment, the number of the inlet holes 211A is four, and the number of the convergence troughs 212A is four as well. The convergence chamber 213A is at the center portion of the inlet plate 21A. One end of each of the four convergence troughs 212A is connected to the corresponding inlet hole 211A, and the other end of each of the four convergence troughs 212A is connected to the convergence chamber 213A at the center portion of the inlet plate 21A. Therefore, the gas can be guided to the convergence chamber 213A from the inlet holes 211A via convergence troughs 212A. In this embodiment, the inlet plate 21A is a one-piece element integrally formed with the inlet hole 211A, the convergence trough 212A, and the convergence chamber 213A.

In some embodiments, the inlet plate 21A is made of stainless steel, but is not limited thereto. In some other embodiments, the depth of the convergence chamber 213A is substantially equal to the depth of the convergence troughs 212A, but is not limited thereto.

The resonance sheet 22A is made of a flexible material, but is not limited thereto. Moreover, the resonance sheet 22A has a perforation 221A corresponding to the convergence chamber 213A of the inlet plate 21A, whereby the gas in the convergence chamber 213A can pass through the resonance sheet 22A. In some other embodiments, the resonance sheet 22A is made of copper, but is not limited thereto.

The piezoelectric actuator 23A is assembled from a suspension plate 231A, an outer frame 232A, at least one supporting element 233A, and a piezoelectric element 234A. The suspension plate 231A has a square shape, and the suspension plate 231A is capable of bending and vibrating. The outer frame 232A is disposed around the periphery of the suspension plate 231A. The supporting element 233A is connected between the suspension plate 231A and the outer frame 232A to provide a flexible support for the suspension plate 231A. The piezoelectric element 234A also has a square shape and is attached to one surface of the suspension plate 231A so as to drive the suspension plate 231A to bend and vibrate when the piezoelectric element 234A is applied with a voltage. The side length of the piezoelectric element 234A is smaller than or equal to a side length of the suspension plate 231A. A plurality of gaps 235A is formed among the suspension plate 231A, the outer frame 232A, and the supporting element 233A for the gas passing therethrough. Moreover, the piezoelectric actuator 23A has a protruding portion 236A disposed on the other surface of the suspension plate 231A. That is, the piezoelectric element 234A and the protruding portion 236A are respectively disposed on the two opposite surfaces of the suspension plate 231A.

Figure 8A:
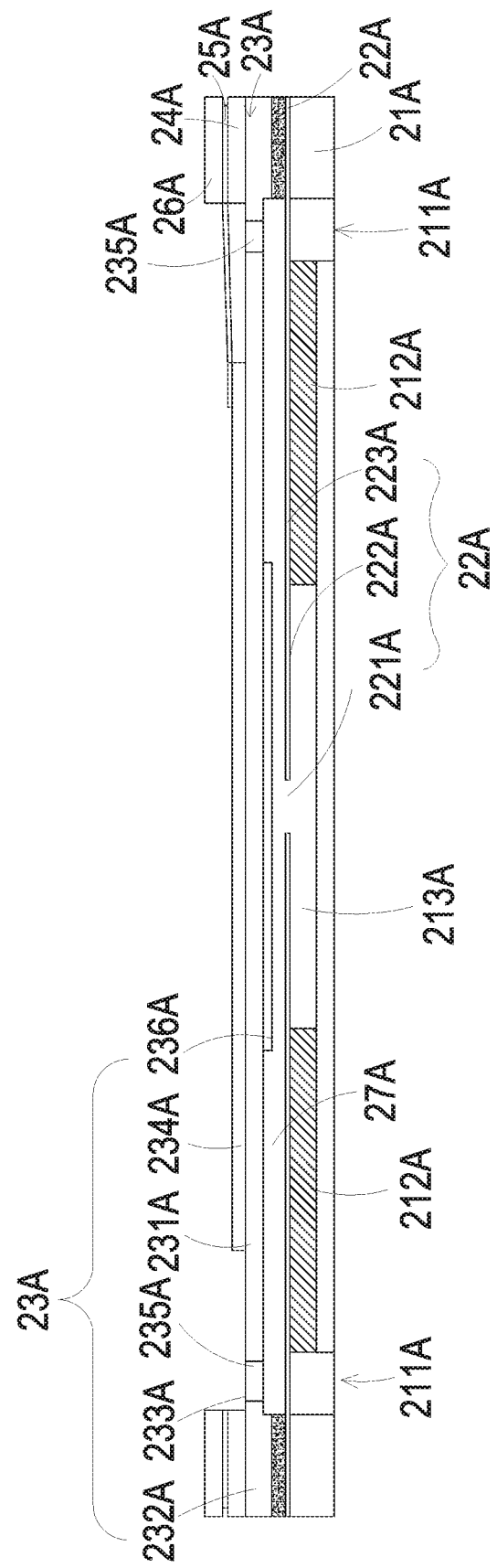
FIG. 8A illustrates a schematic cross-sectional view of the micro pump according to the second embodiment of the present disclosure.
Figure 8B:
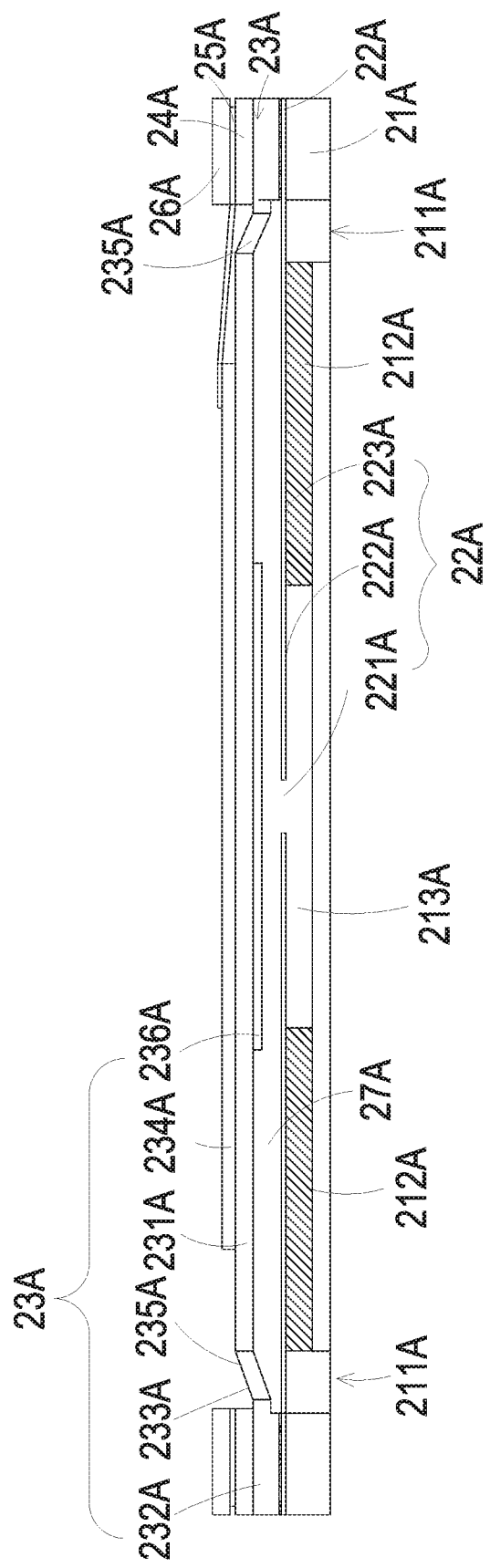
FIG. 8B illustrates a schematic cross-sectional view of a micro pump according to a variation implementation of the second embodiment of the present disclosure.

As shown in FIG. 8A, in some embodiments, the inlet plate 21A, the resonance sheet 22A, the piezoelectric actuator 23A, the first insulation sheet 24A, the conductive sheet 25A, and the second insulation sheet 26A are arranged sequentially and stacked with each other. The thickness of the suspension plate 231A of the piezoelectric actuator 23A is smaller than the thickness of the outer frame 232A. Thus, when the resonance sheet 22A is stacked on the piezoelectric actuator 23A, a chamber space 27A can be formed among the suspension plate 231A of the piezoelectric actuator 23A, the outer frame 232A, and the resonance sheet 22A Please refer to FIG. 8B. FIG. 8B shows another embodiment of the piezoelectric pump. Most of the elements in FIG. 8B are similar to the corresponding elements in FIG. 8A, which are not repeated here. One of the differences between the embodiment shown in FIG. 8B and the embodiment shown in FIG. 8A is that, when the piezoelectric pump in FIG. 8B does not operate, the suspension plate 231A of the piezoelectric actuator 23A extends away from the resonance sheet 22A by a stamping manner, so that the suspension plate 231A and the outer frame 232A are not aligned at the same level. The extended distance of the suspension plate 231A may be adjusted by the supporting elements 233A. In such embodiments, the supporting elements 233A are not parallel to the suspension plate 231A, so that a part of the piezoelectric actuator 23A has a convex profile.

Figure 8C:
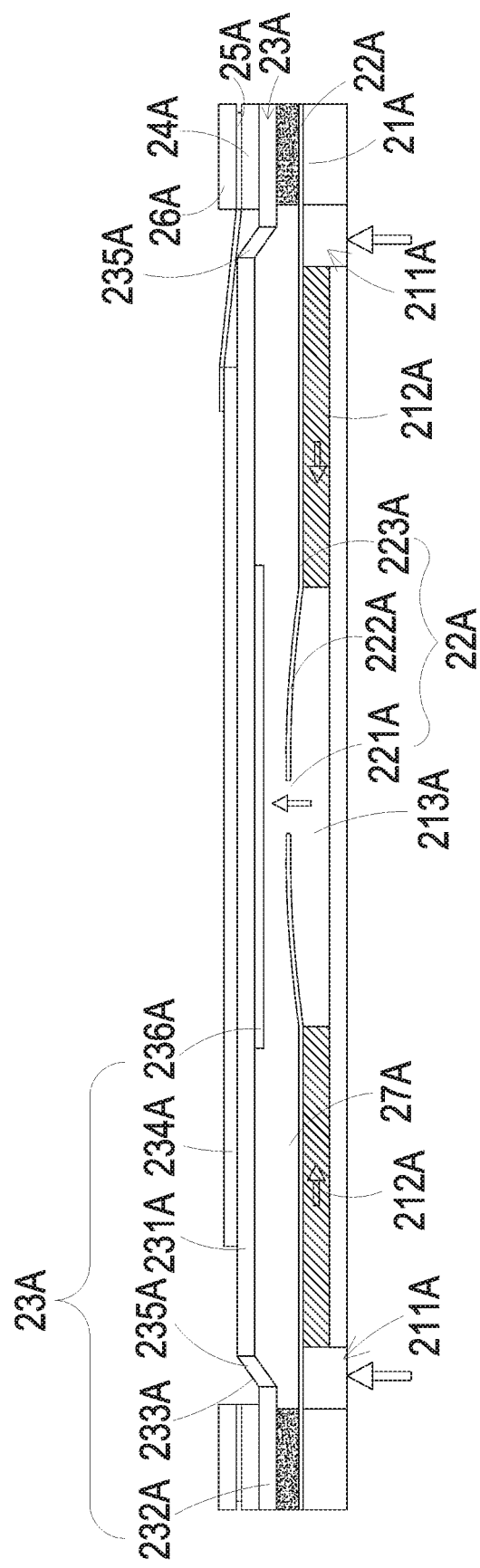
FIG. 8C to FIG. 8E illustrate schematic cross-sectional views showing the micro pump according to the second embodiment of the present disclosure at different operation steps.
Figure 8D:
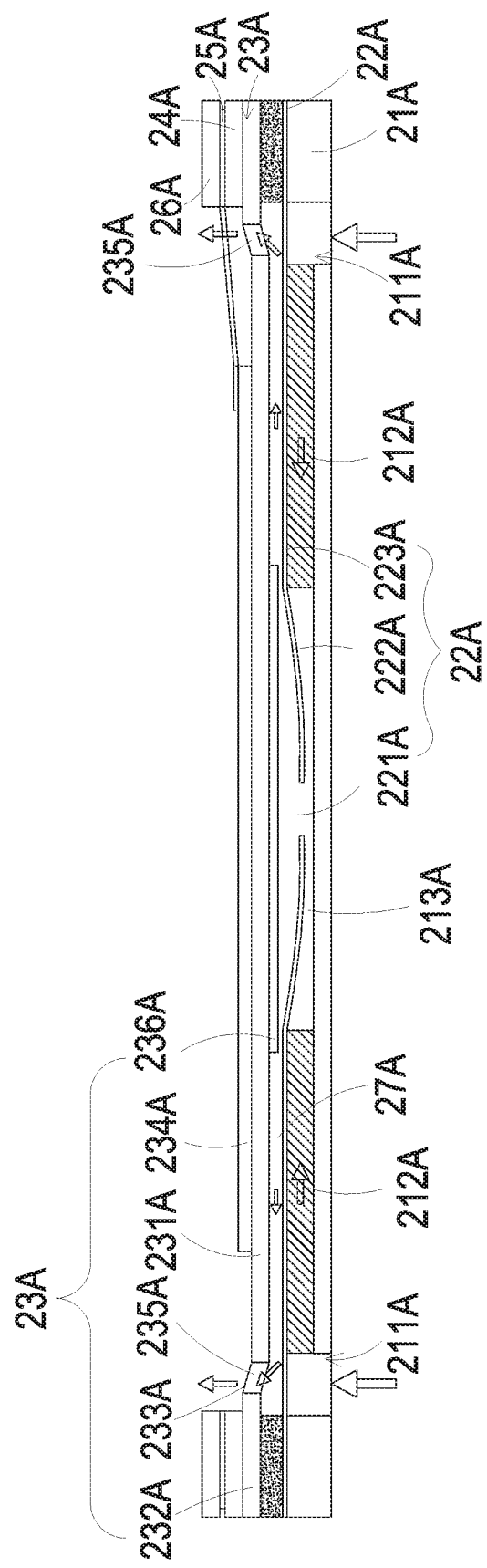
Figure 8E:
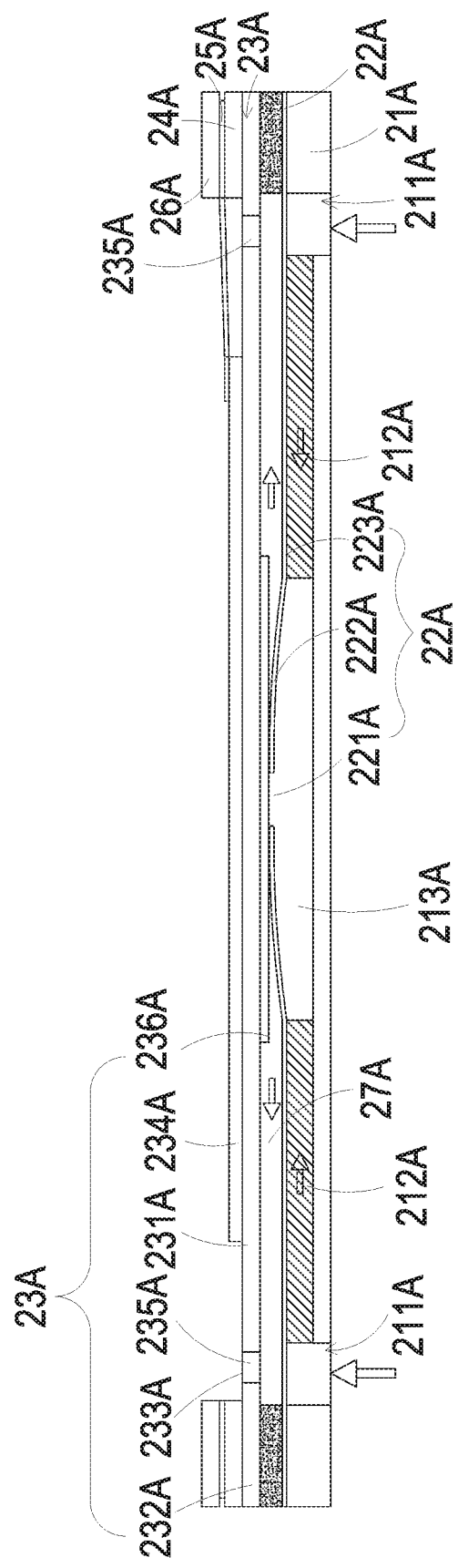

In order to understand the operation of the aforementioned micro pump 2 in transmitting gas, please refer to FIG. 8C to FIG. 8E. Please refer to FIG. 8C first, the piezoelectric element 234A of the piezoelectric actuator 23A deforms after being applied with a driving voltage, and the piezoelectric element 234A drives the suspension plate 231A to move upwardly and to move away from the inlet plate 21A. Thus, the volume of the chamber space 27A is increased and a negative pressure is generated inside the chamber space 27A, thereby drawing the gas in the convergence chamber 213A into the chamber space 27A. At the same time, owing to the resonance effect, the resonance sheet 22A is bent away from the inlet plate 21A correspondingly, which also increases the volume of the convergence chamber 213A. Furthermore, since the gas inside the convergence chamber 213A is drawn into the chamber space 27A, the convergence chamber 213A is in a negative pressure state as well. Therefore, the gas can be drawn into the convergence chamber 213A through the inlet hole 211A and the convergence trough 212A. Then, please refer to FIG. 8D. The piezoelectric element 234A drives the suspension plate 231A to move downwardly and to move toward the inlet plate 21A, thereby compressing the chamber space 27A. Similarly, since the resonance sheet 22A resonates with the suspension plate 231A, the resonance sheet 22A also moves toward the inlet plate 21A, thereby pushing the gas in the chamber space 27A to be transmitted out of the micro pump 2 through the at least one gap 235A. Then, the gas entering into the convergence chamber 213A from the inlet holes 211A, flowing through convergence troughs 212A, and converged at the convergence chamber 213A is guided to the chamber space 27A. Last, please refer to FIG. 8E. When the suspension plate 231A moves resiliently to its original position, the resonance sheet 22A still moves upwardly and to move away from the inlet plate 21A due to the resonance effect as well as the inertia momentum of the resonance sheet 22A. At the time, the resonance sheet 22A compresses the chamber space 27A, so that the gas in the chamber space 27A is moved toward the gap 235A and the volume of the convergence chamber 213A is increased. Accordingly, the gas can be drawn into the convergence chamber 213A continuously through the inlet holes 211A and the convergence troughs 212A and can be converged at the convergence chamber 213A. By continuously repeating the operation steps of the micro pump 2 shown in FIG. 8C to FIG. 8E, the micro pump 2 can make the gas continuously enter into the flow paths formed by the inlet plate 21A and the resonance sheet 22A from the inlet holes 211, thereby generating a pressure gradient. The gas is then transmitted upwardly and outwardly through the gap 235. As a result, the gas can flow at a relatively high speed, thereby achieving the effect of gas transmission of the micro pump 2.

Figure 9A:
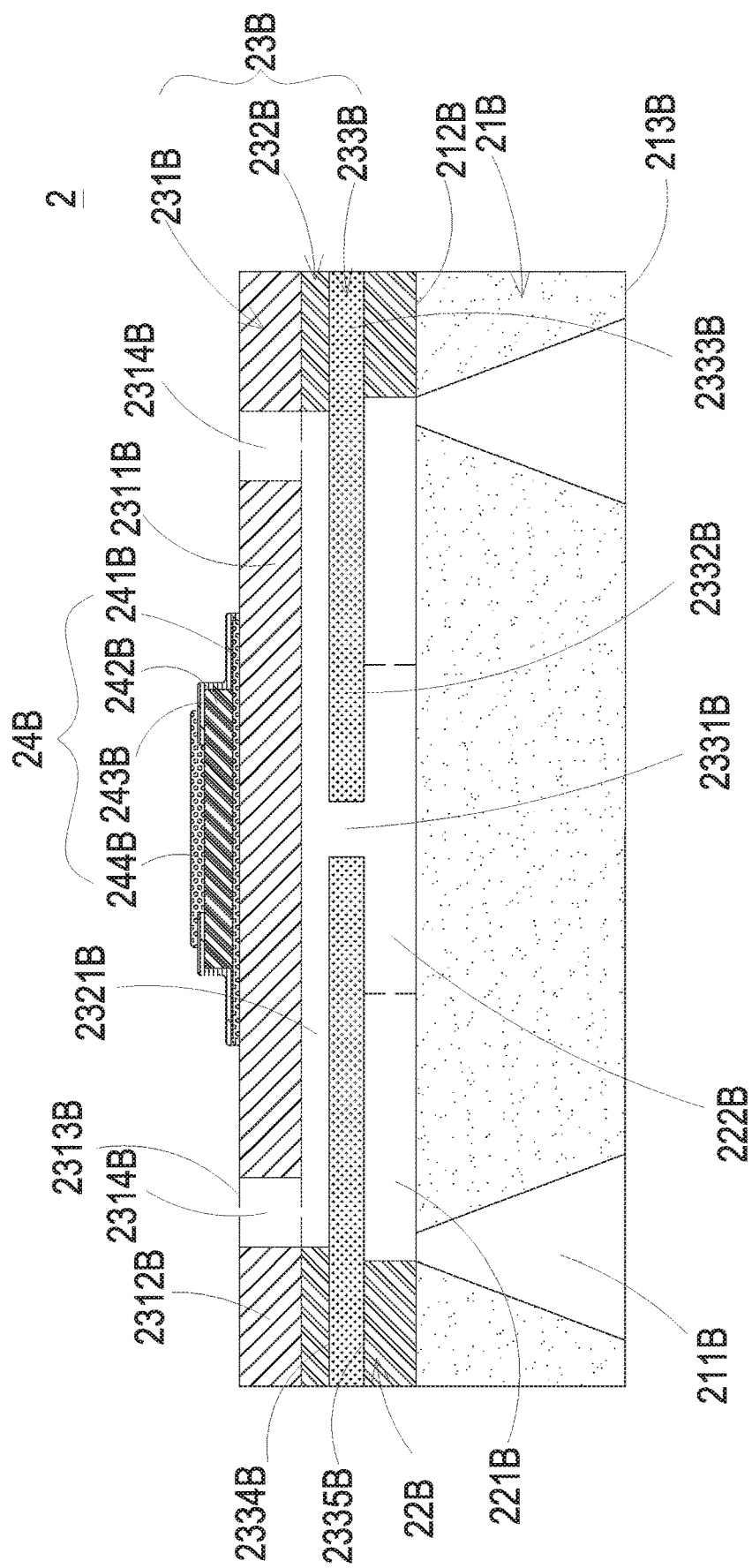
FIG. 9A illustrates a schematic cross-sectional view of a micro pump according to a third embodiment of the present disclosure.
Figure 9B:
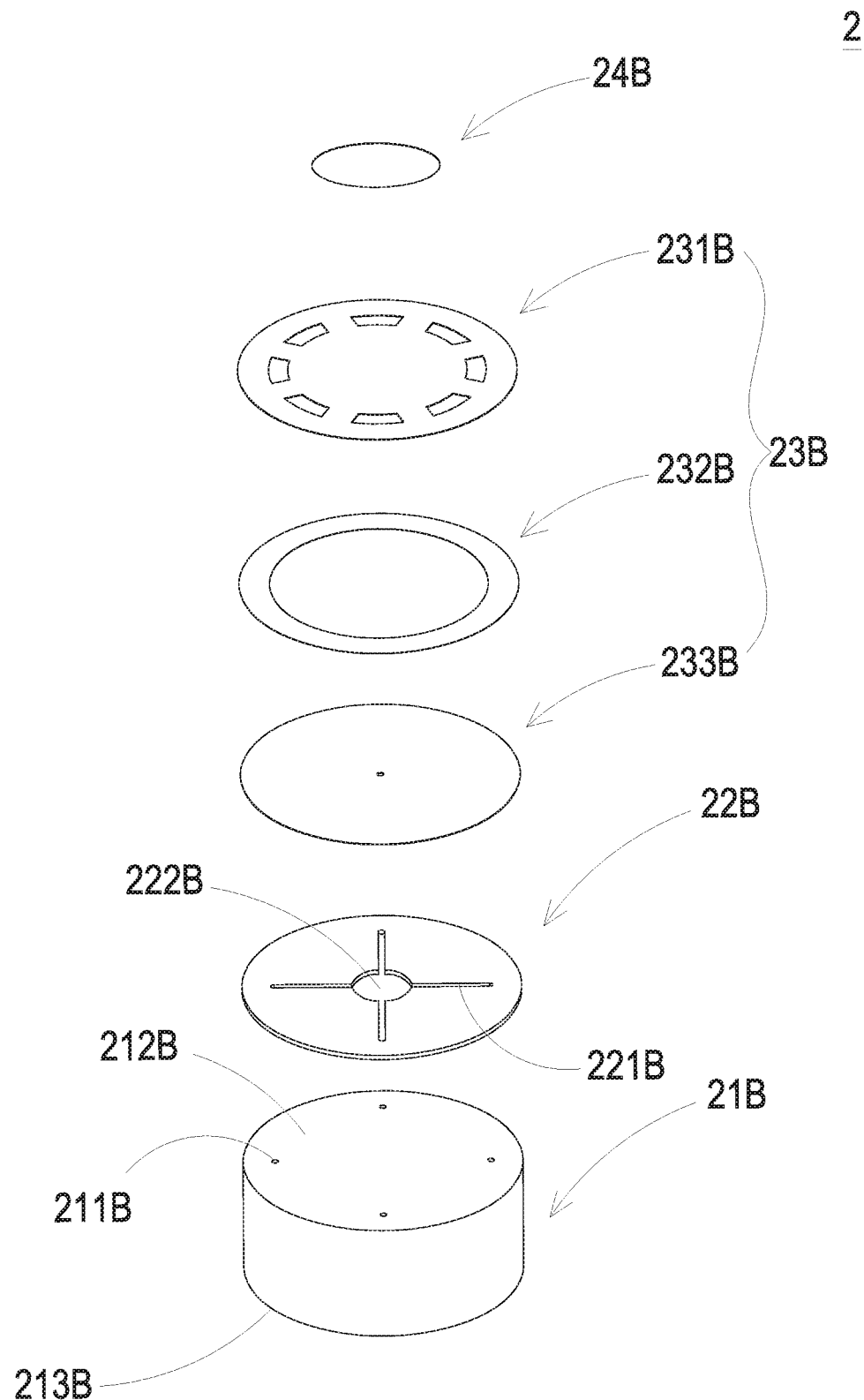
FIG. 9B illustrates a schematic exploded view of the micro pump according to the third embodiment of the present disclosure.

In a third embodiment of the present disclosure, the micro pump 2 may be a micro-electromechanical systems (MEMS) pump. Please refer to FIG. 9A and FIG. 9B, the MEMS pump includes a first substrate 21B, a first oxide layer 22B, a second substrate 23B, and a piezoelectric component 24B. It should be understood that in FIG. 9B, components of the MEMS pump cannot be actually taken apart since the MEMS pump is fabricated integrally by semiconductor manufacturing processes including epitaxy, deposition, lithography, and etching. However, in order to clearly explain the detailed structure of the MEMS pump, the exploded view is illustrated in FIG. 9B and used to explain the characteristics of the MEMS pump.

The first substrate 21B is a silicon wafer (Si wafer), and the thickness of the Si wafer may be between 150 and 400 μm (micrometer). The first substrate 21B has a plurality of inlets 211B, a first surface 212B, and a second surface 213B. In this embodiment, the number of the inlets 211B is four, but not limited thereto. Each of the inlets 211B penetrates the first substrate 21B from the second surface 213B to the first surface 212B. In order to improve the inflow efficiency of the inlets 211B, each of the inlets 211B is a conical hole, that is, each of the inlets 211B is conical and tapered from the second surface 213B to the first surface 212B.

The first oxide layer 22B is a silicon dioxide ($SiO_2$) film. The thickness of the $SiO_2$ film is between 10 and 20 μm. The first oxide layer 22B is stacked on the substrate first surface 212B of the first substrate 21B. The first oxide layer 22B has a plurality of convergence channels 221B and a convergence chamber 222B. The number and the position of the convergence channel 221B correspond to the number and the position of the inlets 211B in the first substrate 21B. In this embodiment, the number of the convergence channels 221B is four as well. One of two ends of each of the four convergence channels 221B is in communication with the corresponding inlet 211B in the first substrate 21B. The other end of the two ends of each of the four convergence channels 221B is in communication with the convergence chamber 222B. Thus, after the gas enters into the first substrate 21B from the inlets 211B, the gas flows through the convergence channels 221B and then is converged at the convergence chamber 222B.

The second substrate 23B is combined to the first substrate 21B, and the second substrate 23B includes a silicon wafer layer 231B, a second oxide layer 232B, and a silicon material layer 233B. The silicon wafer layer 231B has an actuation portion 2311B, an outer peripheral portion 2312B, a plurality of connection portions 2313B, and a plurality of fluid channels 2314B. The actuation portion 2311B is in a circular shape. The outer peripheral portion 2312B is in a hollow ring shape and surrounds a periphery of the actuation portion 2311B. The connection portions 2313B are respectively connected between the actuation portion 2311B and the outer peripheral portion 2312B. The fluid channels 2314B surround the periphery of the actuation portion 2311B and locate between the connection portions 2313B. The second oxide layer 232B is made of silicon oxide. The thickness of the second oxide layer 232B is between 0.5 and 2 μm. The second oxide layer 232B is formed on the silicon wafer layer 231B. The second oxide layer 232B is in a hollow ring shape, and the second oxide layer 232B and the silicon wafer layer 231B together define a vibration chamber 2321B. The silicon material layer 233B is in a circular shape and stacked on the second oxide layer 232B. The silicon material layer 233B is combined with the first oxide layer 22B. The silicon material layer 233B is a silicon dioxide ($SiO_2$) film, and the thickness of the silicon material layer 233B may be between 2 and 5 μm. The silicon material layer 233B has a through hole 2331B, a vibration portion 2332B, a fixed portion 2333B, a third surface 2334B, and a fourth surface 2335B. The through hole 2331B may be located at a center portion of the silicon material layer 233B. The vibration portion 2332B is located at a peripheral area of the through hole 2331B, and the vibration portion 2332B perpendicularly corresponds to the vibration chamber 2321B. The fixed portion 2333B is located at a peripheral area of the silicon material layer 233B, and the vibration portion 2332B is fixed to the second oxide layer 232B by the fixed portion 2333B. The third surface 2334B is assembled with the second oxide layer 232B, and the fourth surface 2335B is assembled with the first oxide layer 22B. The piezoelectric component 24B is stacked on the actuation portion 2311B of the silicon wafer layer 231B.

The piezoelectric component 24B includes a lower electrode layer 241B, a piezoelectric layer 242B, an insulation layer 243B, and an upper electrode layer 244B. The lower electrode layer 241B is stacked on the actuation portion 2311B of the silicon wafer layer 231B, and the piezoelectric layer 242B is stacked on the lower electrode layer 241B. The piezoelectric layer 242B and the lower electrode layer 241B are electrically connected with each other through the contacted area between each other. Moreover, the width of the piezoelectric layer 242B may be smaller than the width of the lower electrode layer 241B, and thus the lower electrode layer 241B is not completely covered by the piezoelectric layer 242B. The insulation layer 243B is stacked on part of the piezoelectric layer 242B and the remaining portion of the surface of the lower electrode layer 241B which is not covered by the piezoelectric layer 242B. Then, the upper electrode layer 244B is stacked on the insulation layer 243B and the remaining portion of the surface of the piezoelectric layer 242B which is not covered by the insulation layer 243B, and thus the upper electrode layer 244B is electrically connected to the piezoelectric layer 242B through the contact between each other. Moreover, since the insulation layer 243B is inserted between the upper electrode layer 244B and the lower electrode layer 241B, a short circuit condition caused by the direct contact between the upper electrode layer 244B and the lower electrode layer 241B could be avoided.

Figure 10A:
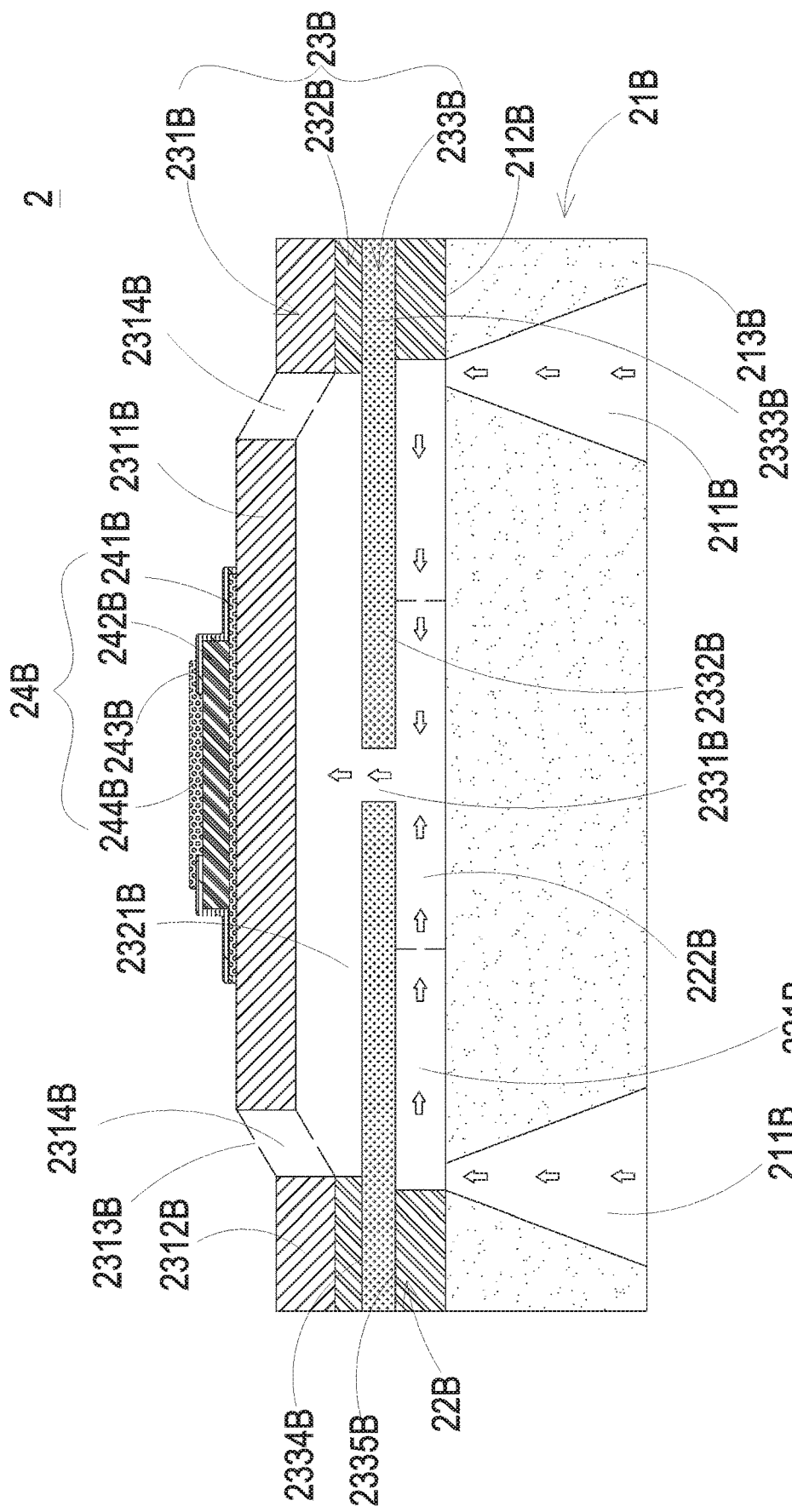
FIG. 10A to FIG. 10C illustrate schematic cross-sectional views showing the micro pump according to the third embodiment of the present disclosure at different operation steps.
Figure 10B:
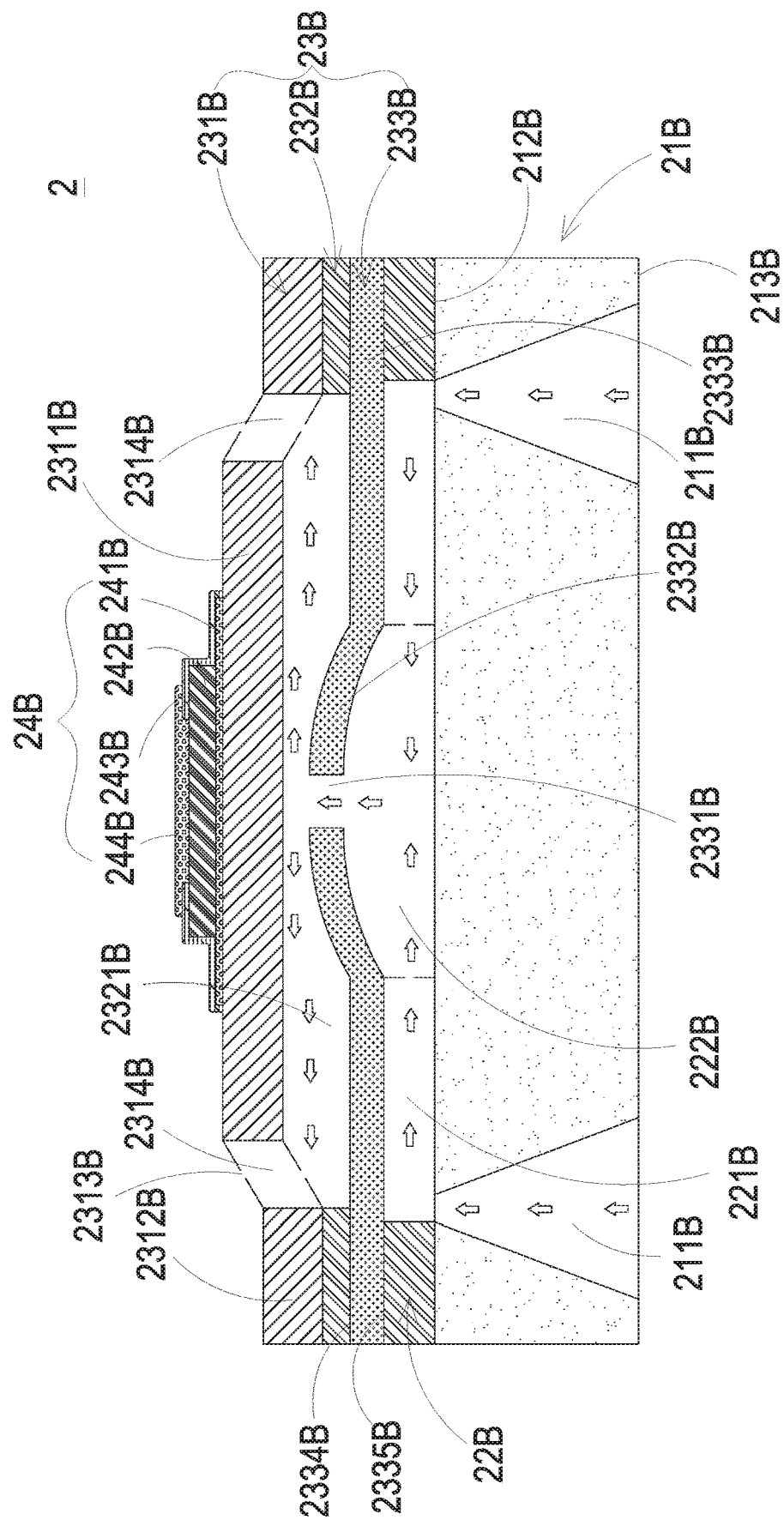
Figure 10C:
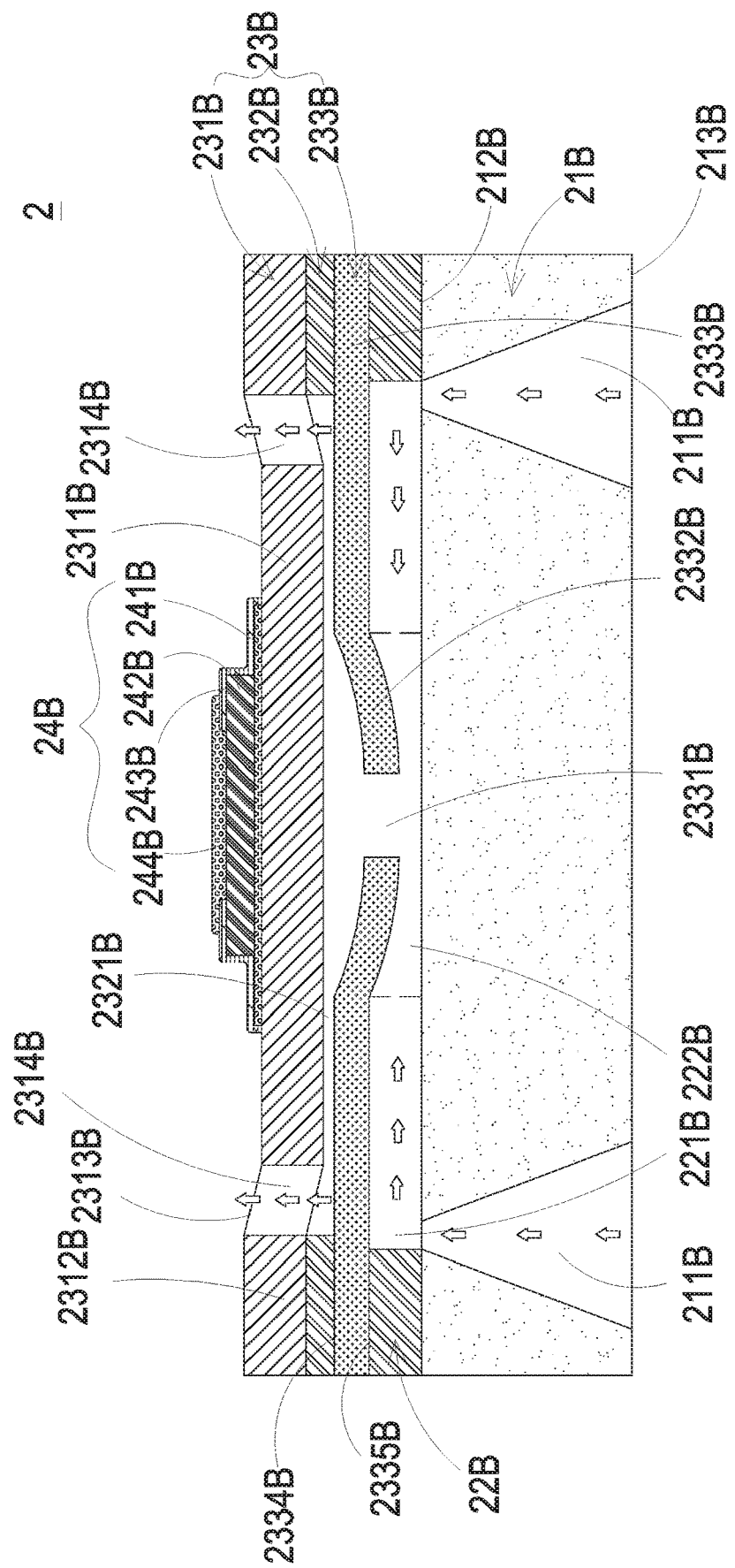
Figure 11:
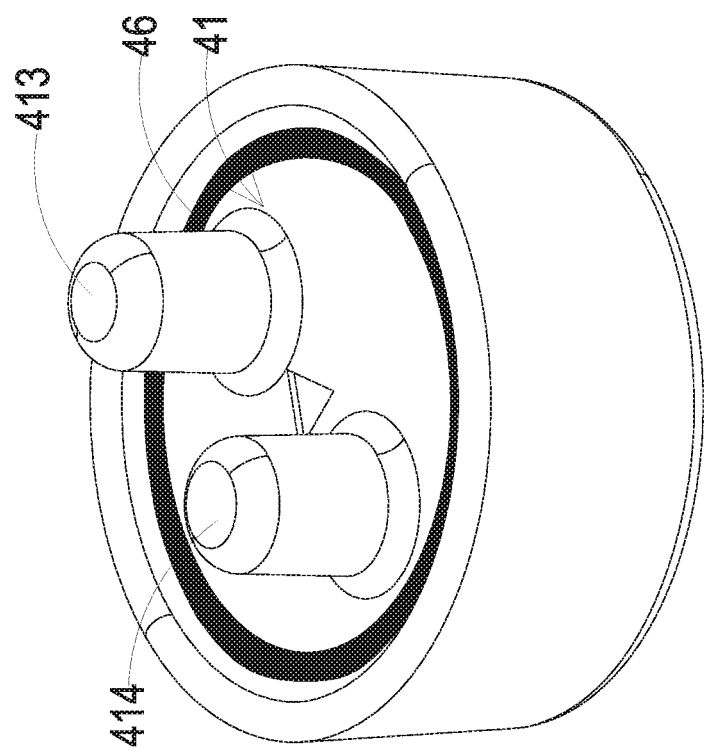
FIG. 11 illustrates a schematic perspective view of a liquid pump according to an exemplary embodiment of the present disclosure.
Figure 12:
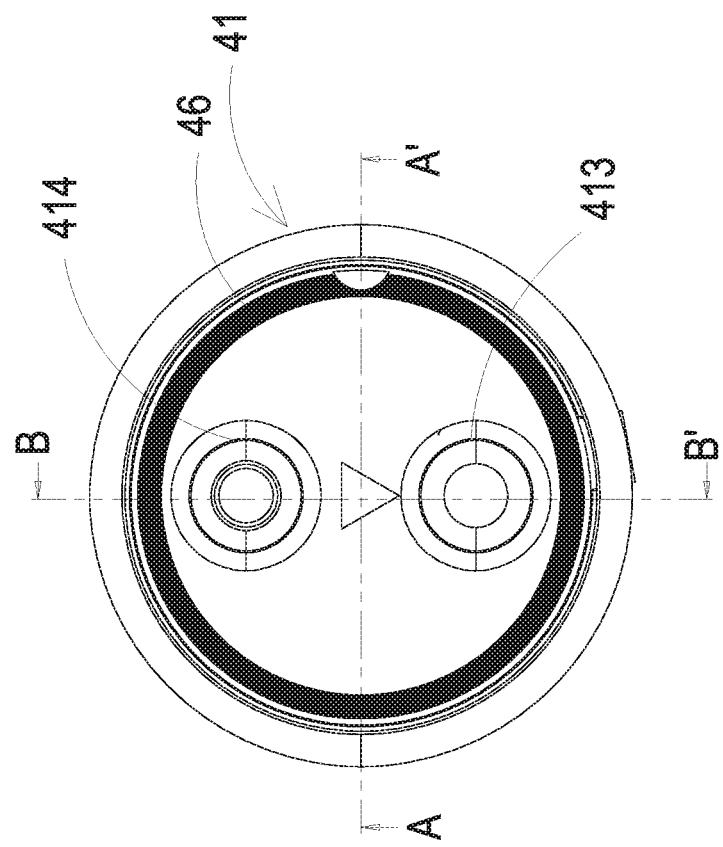
FIG. 12 illustrates a schematic top view of the liquid pump according to the exemplary embodiment of the present disclosure.
Figure 13A:
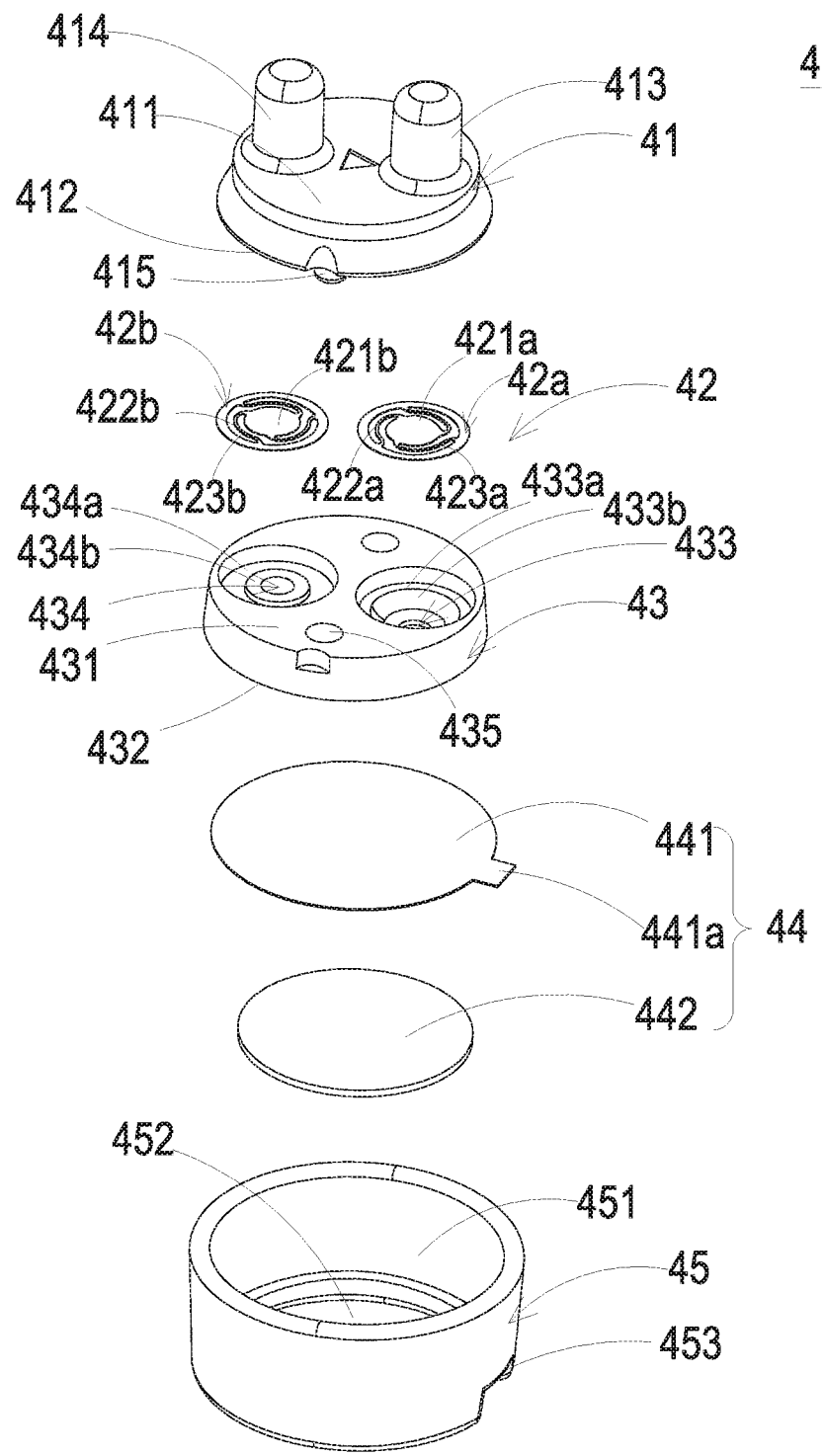
FIG. 13A illustrates a schematic front exploded view of the liquid pump according to the exemplary embodiment of the present disclosure.
Figure 13B:
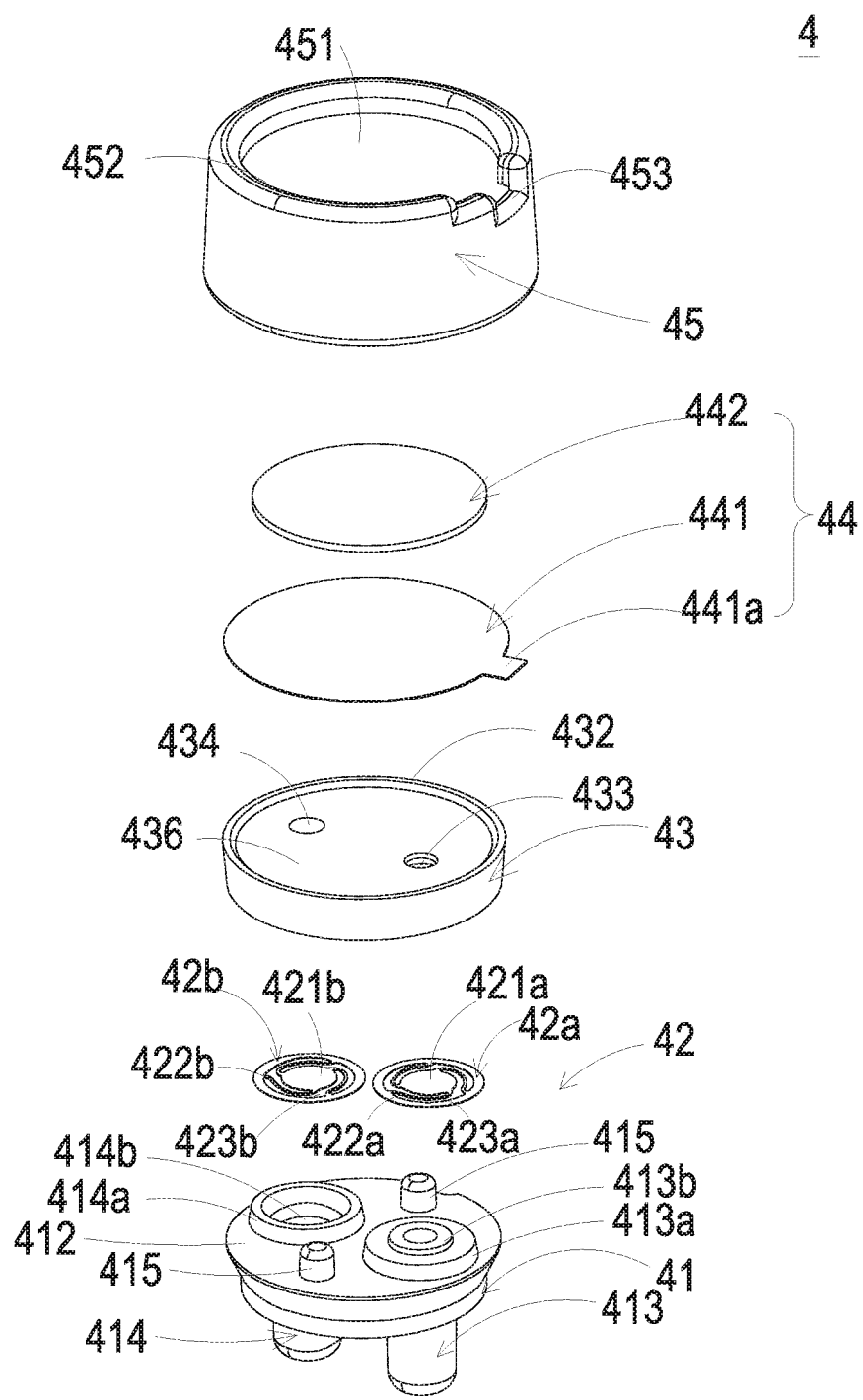
FIG. 13B illustrates a schematic rear exploded view of the liquid pump according to the exemplary embodiment of the present disclosure.

Please refer to FIG. 10A to FIG. 10C. FIG. 10A to FIG. 10C illustrate schematic cross-sectional views showing the micro-electromechanical systems (MEMS) pump at different operation steps. Please refer to FIG. 10A first, when the lower electrode layer 241B and the upper electrode layer 244B of the piezoelectric component 24B receive a driving voltage and a driving signal, the voltage and the signal are transmitted to the piezoelectric layer 242B. After the piezoelectric layer 242B is applied with the driving voltage and the driving signal, the piezoelectric layer 242B starts to deform because of the reverse piezoelectric effect, thereby driving the actuation portion 2311B of the silicon wafer layer 231B to move correspondingly. When the actuation portion 2311B is driven upwardly by the piezoelectric component 24B and thus the distance between the actuation portion 2311B and the second oxide layer 232B increases, the volume of the vibration chamber 2321B in the second oxide layer 232B increases as well. Hence, the pressure in the vibration chamber 2321B becomes negative, and thus the gas in the convergence chamber 222B of the first oxide layer 22B is drawn into the vibration chamber 2321B through the through hole 2331B. Please refer to FIG. 10B, when the actuation portion 2311B is driven upwardly by the piezoelectric component 24B, the vibration portion 2332B of the silicon material layer 233B is moved upwardly due to the resonance effect. When the vibration portion 2332B is moved upwardly, the space of the vibration chamber 2321B is compressed and the gas in the vibration chamber 2321B is pushed to fluid channels 2314B of the silicon wafer layer 231B, so that the gas can be discharged upwardly through the fluid channels 2314B. When the vibration portion 2332B is moved upwardly to compress the space of the vibration chamber 2321B, the volume of the convergence chamber 222B increases owing to the movement of the vibration portion 2332B. Hence, the pressure in the convergence chamber 222B becomes negative, and thus the gas outside of the MEMS pump is drawn into the convergence chamber 222B through the inlets 211B. In the last step, as shown in FIG. 10C, when the actuation portion 2311B of the silicon wafer layer 231B is driven downwardly by the piezoelectric component 24B, the gas in the vibration chamber 2321B is pushed to the fluid channels 2314B and then discharged out of the vibration chamber 2321B. The vibration portion 2332B of the silicon material layer 233B is also driven by the actuation portion 2311B and thus moved downwardly; at the same time, the vibration portion 2332B compresses the gas in convergence chamber 222B and forces the gas to move to the vibration chamber 2321B through the through hole 2331B. Accordingly, when the actuation portion 2311B is driven upwardly by the piezoelectric component 24B again later, the volume of the vibration chamber 2321B greatly increases, thereby generating a stronger suction force to draw the gas into the vibration chamber 2321B. By repeating the aforementioned steps, the actuation portion 2311B can be continually driven by the piezoelectric component 24B to move upwardly and downwardly, and the vibration portion 2332B is also driven to move upwardly and downwardly correspondingly. Thus, the internal pressure of the MEMS pump can be changed periodically so as to draw and discharge the gas continuously, thereby completing the pumping process of the MEMS pump.

Figure 4:
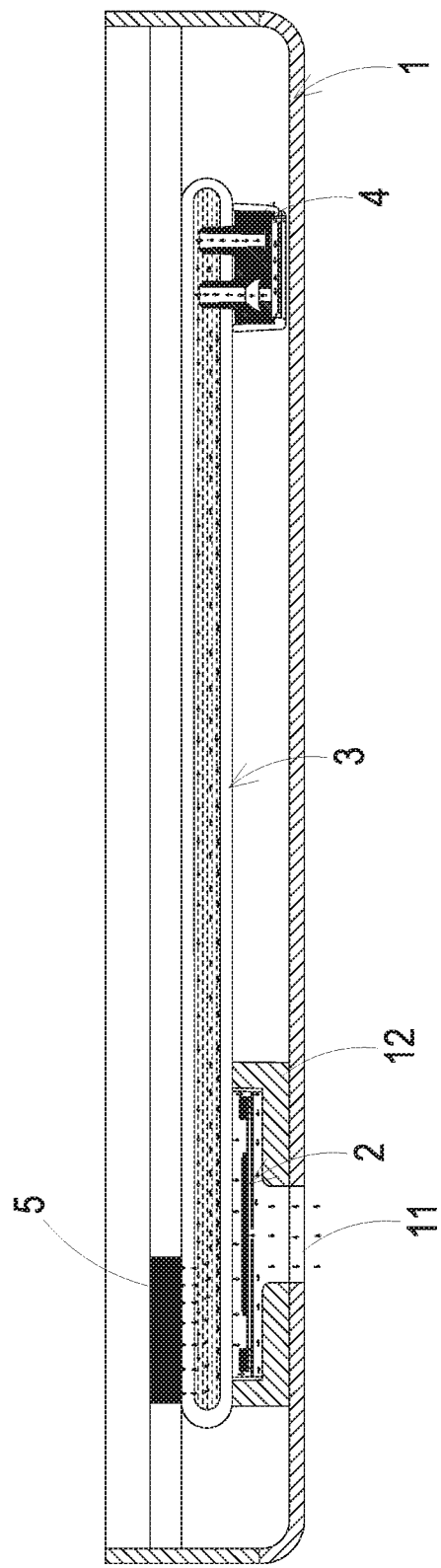
FIG. 4 illustrates a schematic cross-sectional view of the heat-dissipating component for a mobile device according to the exemplary embodiment of the present disclosure.
Figure 5A:
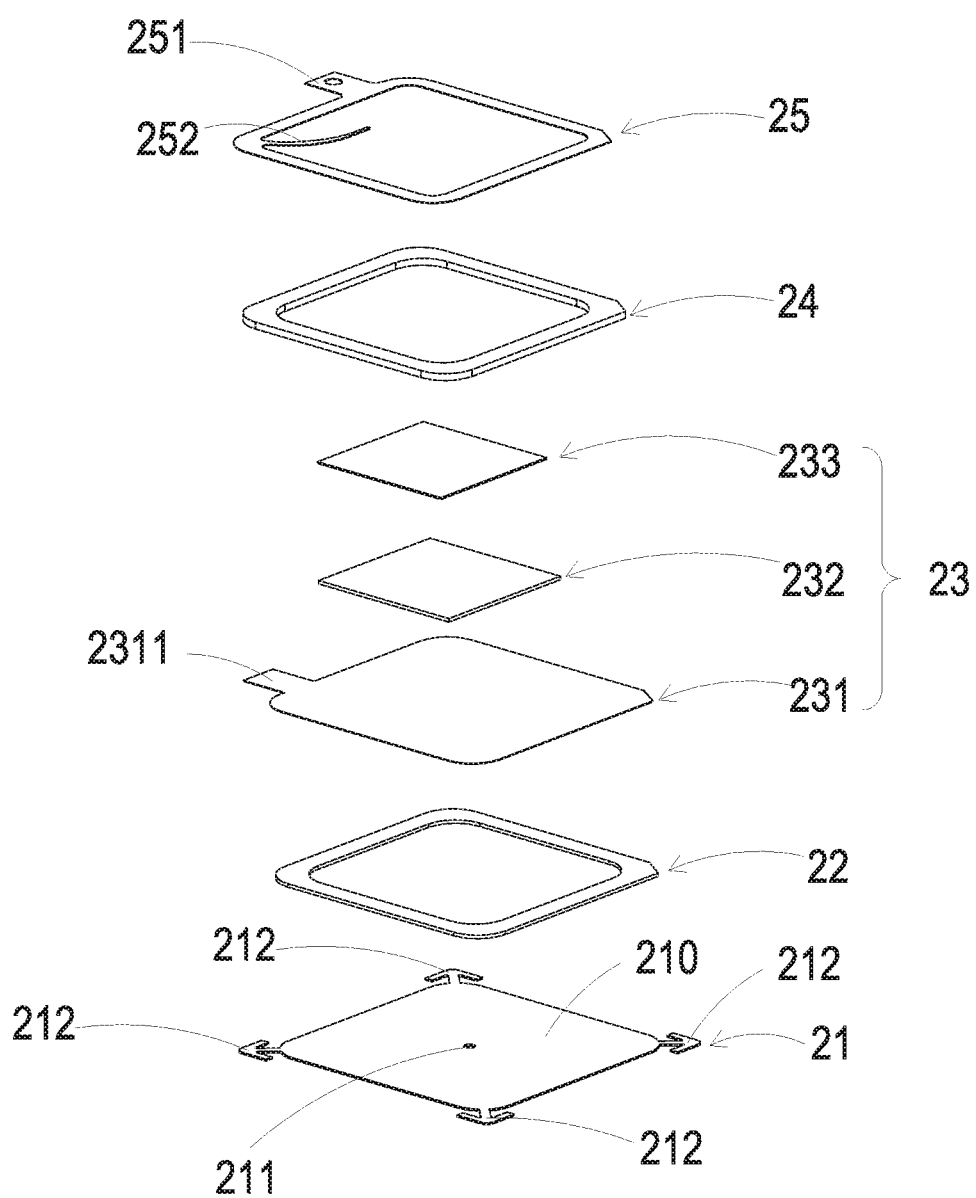
FIG. 5A illustrates a schematic front exploded view of a micro pump according to a first embodiment of the present disclosure.
Figure 5B:
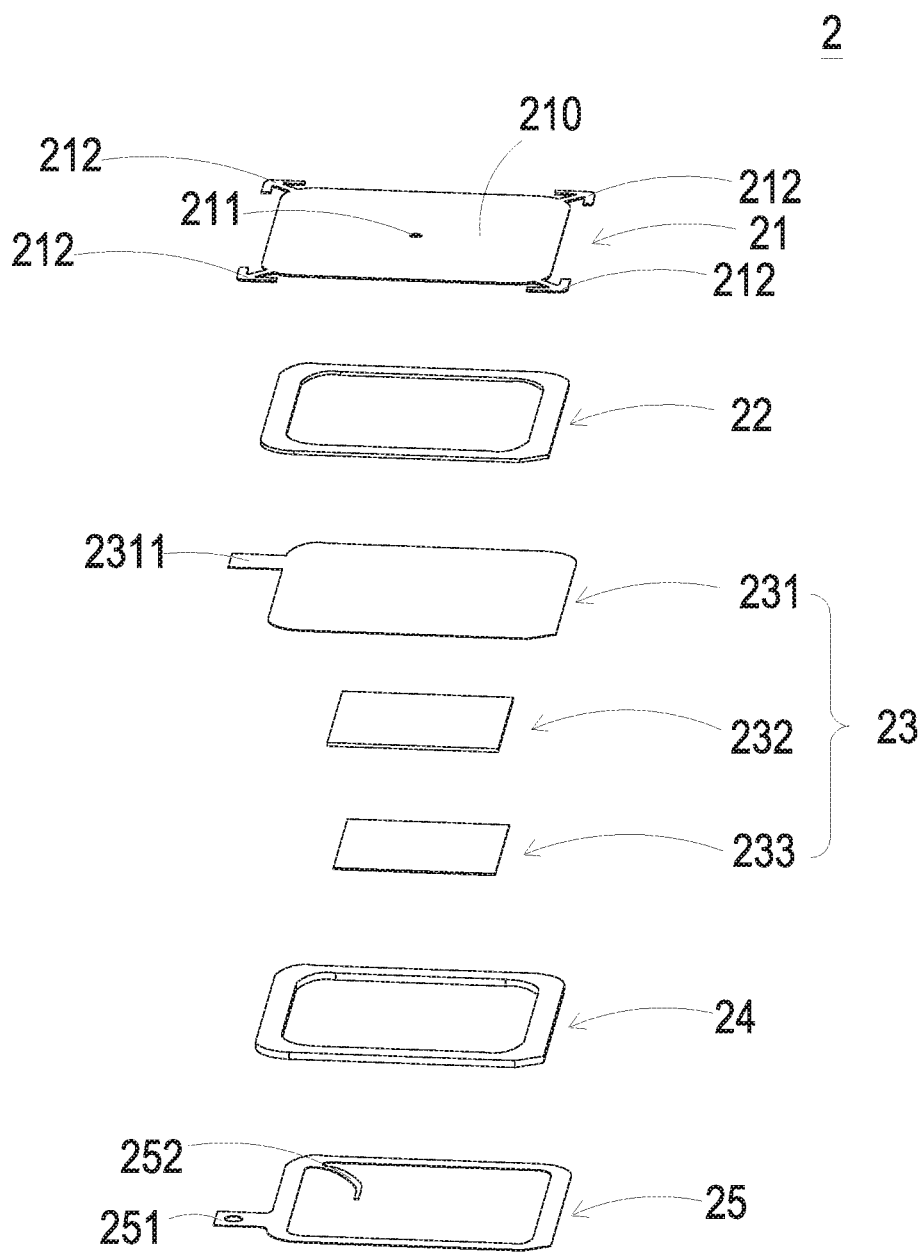
FIG. 5B illustrates a schematic rear exploded view of the micro pump according to the first embodiment of the present disclosure.

Please refer to FIG. 4. In some embodiments, the heat-dissipating component for a mobile device of the present disclosure may further include a liquid pump 4. The liquid pump 4 is connected to the heat dissipation tube plate 3 and is in communication with inside of the heat dissipation tube plate 3. Therefore, after the liquid pump 4 starts to operate, the cooling fluid inside the heat dissipation tube plate 3 is capable of being pumped and circulating, thereby improving the flow rate of the cooling fluid and thus the heat of the heat dissipation tube plate 3 can be dissipated much rapidly, so that the heat exchange effect of the heat dissipation tube plate 3 is accelerated.

Please refer to FIG. 11 to FIG. 13B. The liquid pump 4 includes a valve cover 41, two sets of valve sheets 41, a valve base 43, an actuating device 44, and an outer barrel 45. The actuating device 44, the valve base 43, the two sets of valve sheets 42, and the valve cover 41 are sequentially arranged and placed in the outer barrel 45, and a sealing glue 46 is filled to seal the inner space of the outer barrel 45 for fixing components therein.

Please refer to FIG. 11, FIG. 13A, FIG. 13B, and FIG. 15. The valve cover 41 has a valve cover first surface 411, a valve cover second surface 412, an inlet channel 413, an outlet channel 414, and a plurality of latches 415. The inlet channel 413 and the outlet channel 414 respectively penetrate the valve cover 41 from the valve cover first surface 411 to the valve cover second surface 412. An inlet convex structure 413a is formed on the valve cover second surface 412 surrounding the outer edge of the inlet channel 413, and a first protruding structure 413b is disposed on the inlet convex structure 413a. An outlet convex structure 414a is formed on the valve cover second surface 412 and surrounds the outer edge of the outlet channel 414, and a center portion of the outlet convex structure 414a is recessed to form an outlet chamber 414b. The latches 415 protrude out from the valve cover second surface 412. In this embodiment, the number of the latches 415 is two, but is not limited thereto. The number of the latches 415 may be adjusted according to the actual positioning needs.

In some embodiments, the main material of the aforementioned two sets of valve sheets 42 is polyimide (PI) polymer material, and the manufacturing method of the valve sheets 42 is the reactive ion etching (RIE) method. The reactive ion etching (RIE) method can be conducted by applying a photosensitive resist to the material where the valve structure is expected to be formed, and after the photosensitive resist is exposed and developed to form a valve structure pattern of the valve sheets 42, the material is etched by the reactive ion. Since the portion of the polyimide plate covered by the photosensitive resist would not be etched, the desired valve structure of the valve sheets 42 can be etched out. The two sets of valve sheets 42 include a first valve sheet 42a and a second valve sheet 42b. The first valve sheet 42a and the second valve sheet 42b respectively have central valve sheets 421a, 421b. A plurality of extending supporting elements 422a, 422b is disposed around a periphery of each of the central valve sheets 421a, 421b for providing a flexible support. Hollow through holes 423a, 423b are formed between each of two adjacent the extending supporting elements 422a, 422b, respectively.

Figure 14:
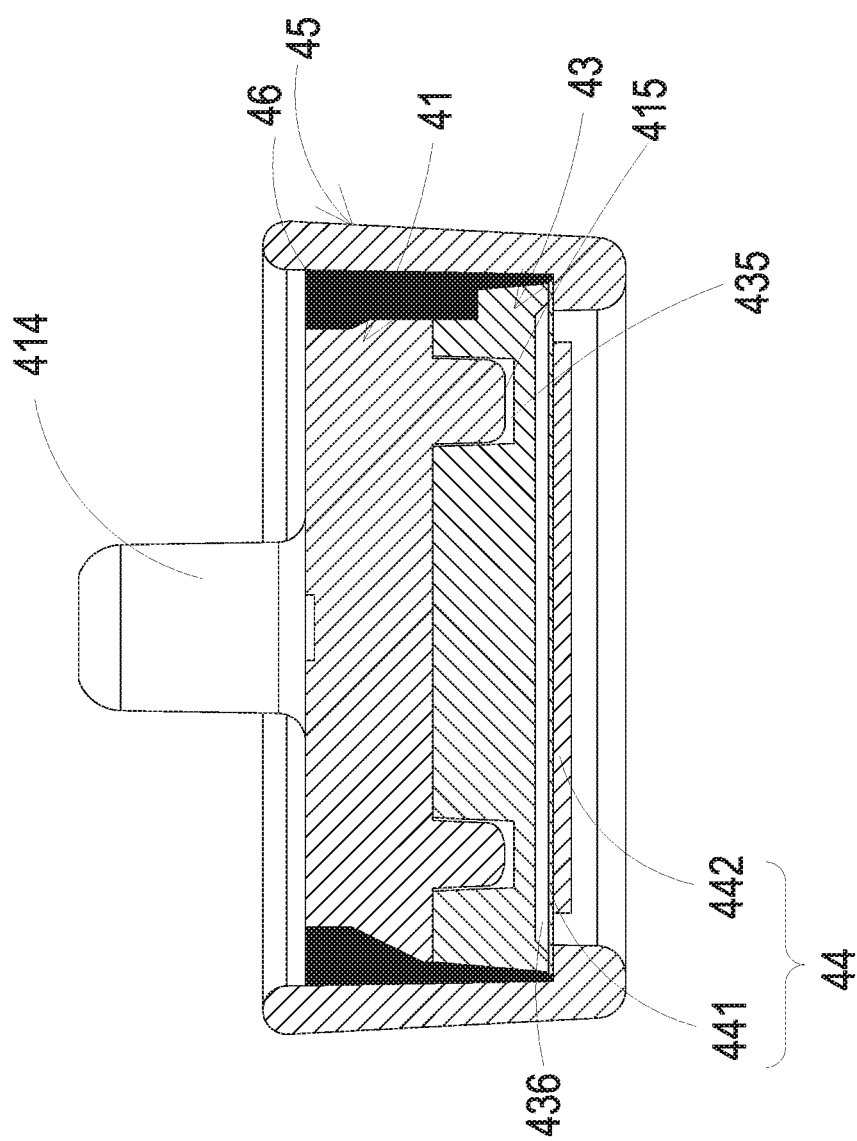
FIG. 14 illustrates a schematic cross-sectional view of the liquid pump shown in FIG. 12 along the line AA'.
Figure 15:
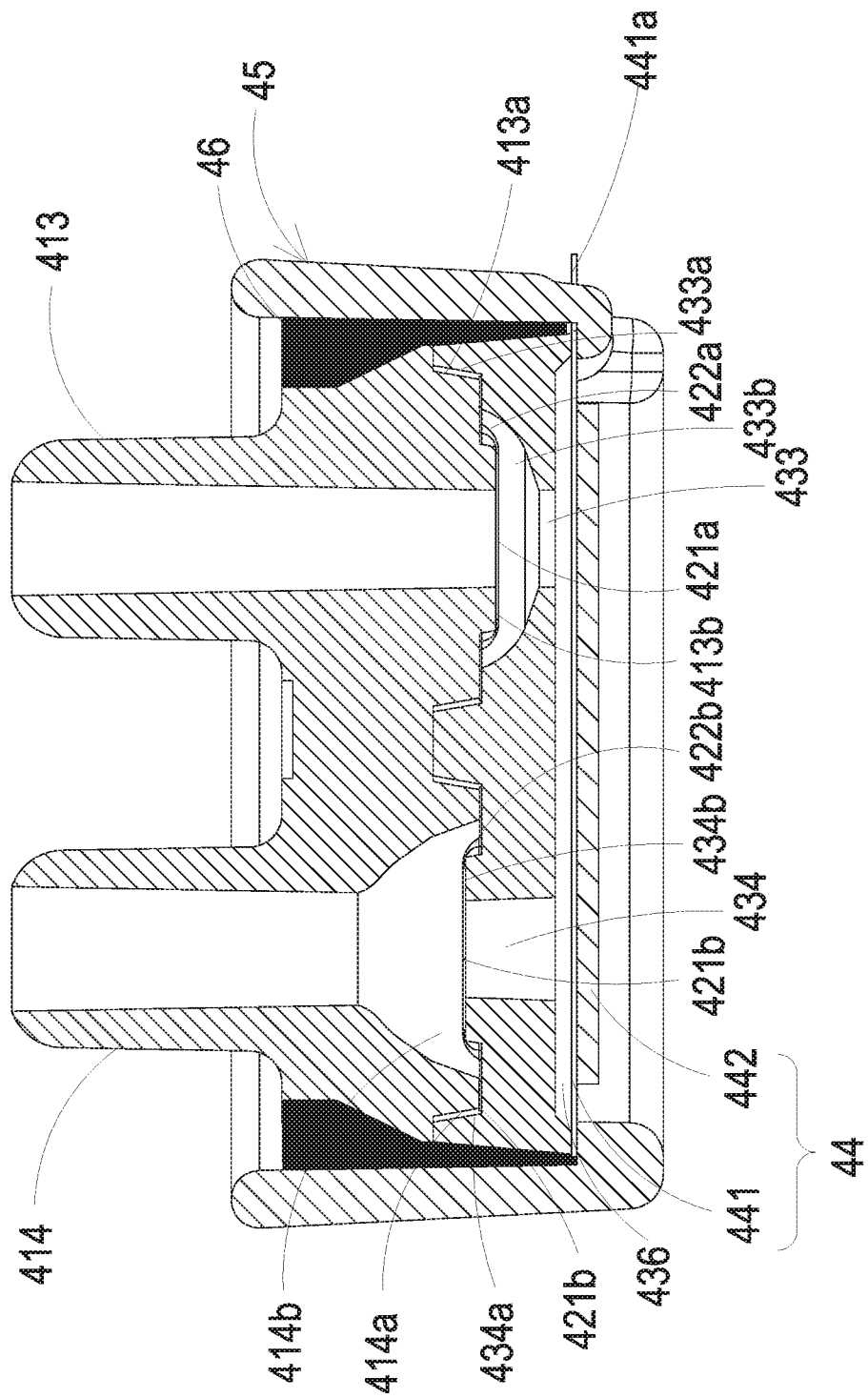
FIG. 15 illustrates a schematic cross-sectional view of the liquid pump shown in FIG. 12 along the line BB'.

The valve base 43 is connected to the valve cover 41. The first valve sheet 42a and the second valve sheet 42b are respectively disposed between the valve base 43 and the valve cover 41. The valve base 43 has a valve base first surface 431, a valve base second surface 432, an inlet valve channel 433, and an outlet valve channel 434. The inlet valve channel 433 and the outlet valve channel 434 respectively penetrate the valve base 43 from the valve base first surface 431 to the valve base second surface 432. The inlet valve channel 433 is recessed at an inner edge of the valve base first surface 431 to form an inlet concave structure 433a for being connected to the inlet convex structure 413a of the valve cover 41. The first valve sheet 42a is disposed between the inlet concave structure 433a and the inlet convex structure 413a, so that the central valve sheet 421a contacts against the first protruding structure 413b of the valve cover 41 to close the inlet channel 413 of the valve cover 41. The central valve sheet 421a of the first valve sheet 42a normally contacts against the first protruding structure 413b so as to generate a perforce (as shown in FIG. 15). Such preforce facilitates the central valve sheet 421a to be tightened up on the first protruding structure 413b and thus prevents the liquid from suffering backflow. Moreover, a center portion of the inlet concave structure 433a is recessed to form an inlet chamber 433b. The outlet valve channel 434 is recessed at an inner edge of the valve base first surface 431 to form an outlet concave structure 434a, and a second protruding structure 434b is disposed at a center portion of the outlet concave structure 434a. The outlet concave structure 434a is connected to the outlet convex structure 414a of the valve cover 41, and the second valve sheet 42b is disposed between the outlet concave structure 434a and the outlet convex structure 414a, so that the central valve sheet 421b contacts against the second protruding structure 434b so as to close the outlet valve channel 434 of the cover base 43. The central valve sheet 421b of the second valve sheet 42b normally contacts against the second protruding structure 434b so as to generate a perforce (as shown in FIG. 15). Such preforce facilitates the central valve sheet 421b to be tightened up on the second protruding structure 434b and thus prevents the liquid from suffering backflow. Moreover, a plurality of latch grooves 435 is disposed on the valve base first surface 431 corresponding to positions of the latches 415 on the valve cover 41, and the number of the latch grooves 435 is the same as that of the latches 415. Accordingly, as shown in FIG. 14, the latches 415 of the valve cover 41 are inserted into corresponding latch grooves 435 of the valve base 43, so that the valve base 43 is connected to the valve cover 41 to enclose the first valve sheet 42a and the second valve sheet 42b, thereby achieving assembling and positioning between the valve base 43 and the valve cover 41. In this embodiment, the number of the latches 415 is two, so the number of the latch grooves 435 is two as well, but is not limited thereto. The number and position may be adjusted according to the actual positioning needs. The valve base second surface 432 is recessed to form a flow convergence chamber 436 in communication with the inlet valve channel 433 and the outlet valve channel 434.

The actuating device 44 includes a vibration sheet 441 and a piezoelectric element 442. The vibration sheet 441 may be made of the same metal material or different metal materials. The piezoelectric element 442 may be made of lead-zirconate-titanate (PZT) type piezoelectric powder with high piezoelectric constant. The piezoelectric element 442 is attached to one side of the vibration sheet 441, and the vibration sheet 441 covers the valve base second surface 432 of the valve base 43 so as to close the flow convergence chamber 436. Moreover, the vibration sheet 441 has a conducting pin 441a for being electrically connected to an external power source, so that the piezoelectric element 442 can be driven to deform and vibrate.

The outer barrel 45 has a recessed space 451. The bottom of the recessed space 451 has a hollowed central trough 452 and a penetration opening 453. The penetration opening 453 penetrates the side wall of the outer barrel 45 and thus is in communication with outside. The actuating device 44, the valve base 43, the two sets of the valve sheets 42, and the valve cover 41 are sequentially arranged and placed in the recessed space 451. The conducting pin 441a of the actuating device 44 is disposed in and penetrates through the penetration opening 453. The sealing glue 46 is filled into the recessed space 451 for fixing components in the recessed space 451. The piezoelectric element 442 of the actuating device 44 correspondingly arranged in the central trough 452, and thus the actuating device 44 can vibrate in the central trough 452 when the actuating device 44 is driven.

Figure 16A:
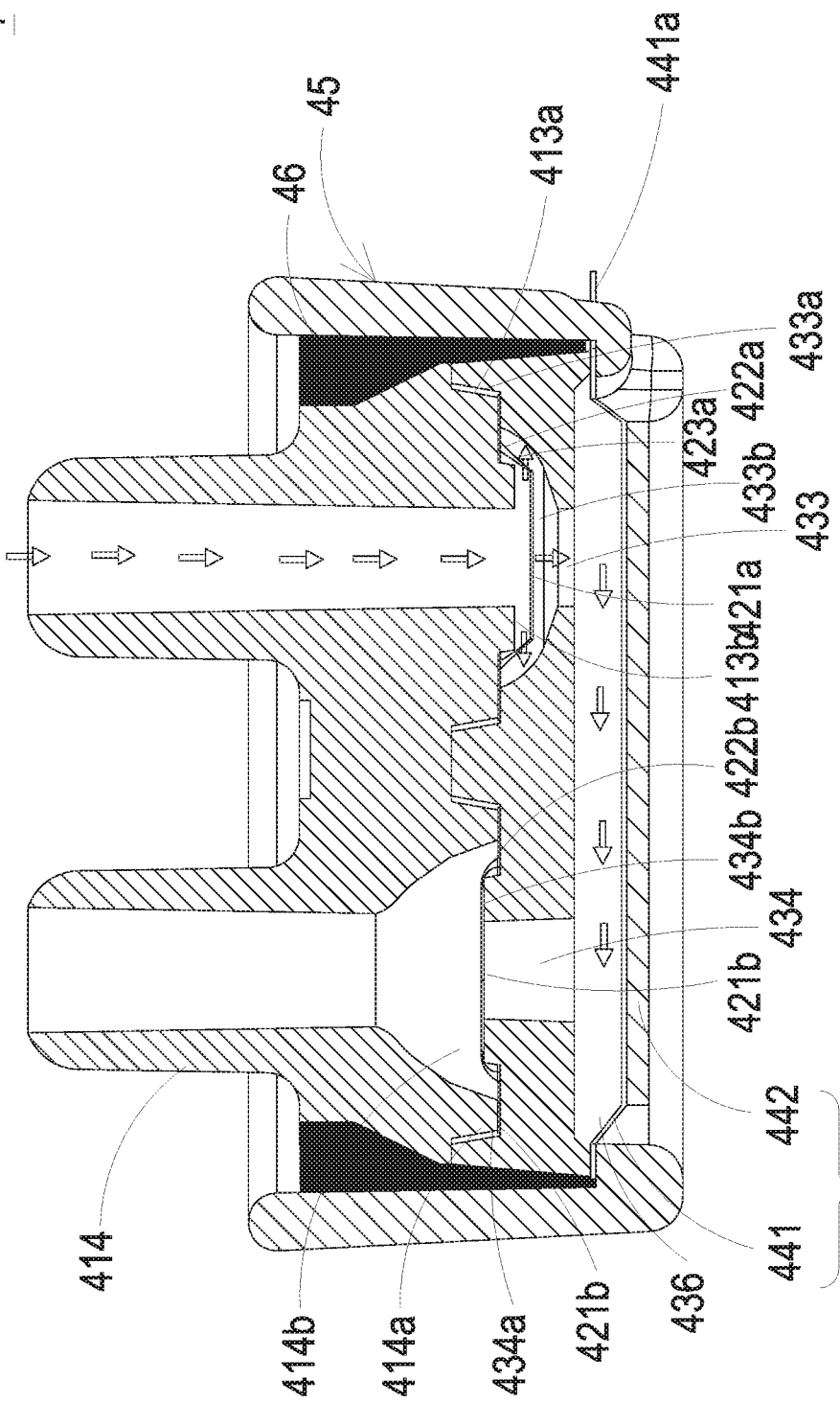
FIG. 16A and FIG. 16B illustrate schematic cross-sectional views showing the liquid pump according to the exemplary embodiment of the present disclosure at different operation steps.
Figure 16B:
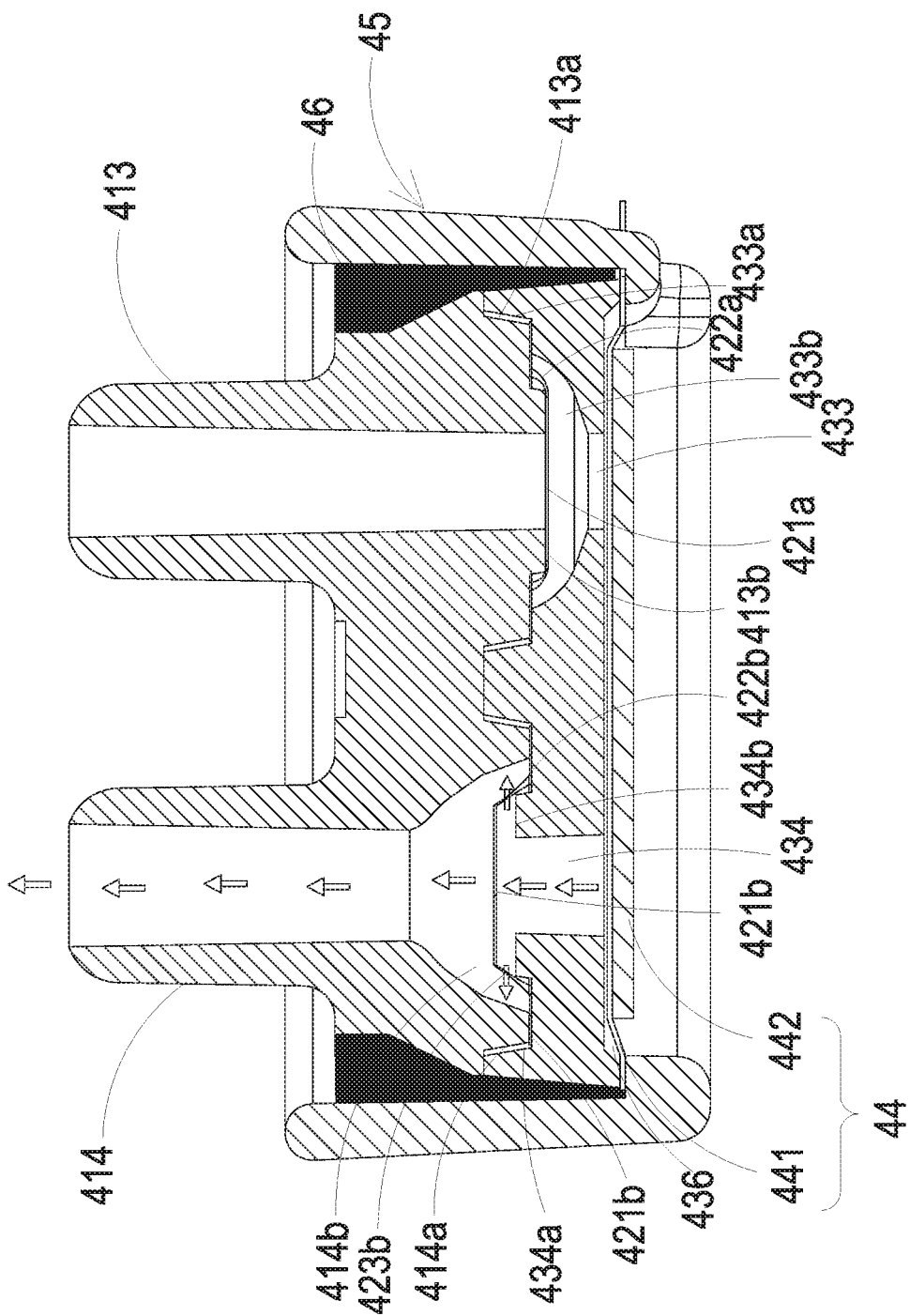

The operation steps of the liquid pump of the present disclosure for implementing the fluid transmission can be explained by FIG. 16A and FIG. 16B. As shown in FIG. 16A, when the piezoelectric element 442 of the actuating device 44 vibrates and moves downwardly, the pressure in the inlet chamber 433b of the valve base 43 becomes negative and thus attractive force is formed in the inlet chamber 433b to pull the central valve sheet 421a of the first valve sheet 42a away and open the inlet channel 413 of the valve cover 41. Thus, the cooling fluid is guided to flow into the liquid pump from the inlet channel 413 of the valve cover 41, flows through the hollow through hole 423a of the first valve sheet 42a, enters into the inlet chamber 433b of the valve base 43, and is converged at the flow convergence chamber 436. Afterwards, as shown in FIG. 16B, when the piezoelectric element 442 of the actuating device 44 vibrates and moves upwardly, the cooling fluid in the flow convergence chamber 436 is pushed toward the outlet valve channel 434 of the valve base 43. Therefore, the central valve sheet 421b of the second valve sheet 42b is pushed to move away and thus not contact the second protruding structure 434b, by which the cooling fluid passes through the hollow through hole 423b of the second valve sheet 42b, enters into the outlet chamber 414b of the valve cover 41, and is discharged out of the liquid pump through the outlet channel 414 to complete the transmission of the cooling fluid.

In summary, the heat-dissipating component for mobile device provided in the present disclosure uses a heat dissipation tube plate with cooling fluid inside to dissipate heat from the heating element of the mobile device (such as a processing chip), and the heat-dissipating component uses a liquid pump to speed up the flow rate of the cooling fluid, so that the heat can be quickly and evenly dissipated throughout the heat dissipation tube plate, thereby enhancing the heat dissipation effect. Moreover, the micro pump is further used to transmit gas to the heat dissipation tube plate for performing heat exchange with the heat dissipation tube plate so as to reduce the temperature of the heat dissipation tube plate. With the structure, the heat dissipation effect can be raised, which can effectively reduce the overheat problem of a mobile device processor. Thus, the industrial value of the present application is very high and the present application has inventive steps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A heat-dissipating component for a mobile device, comprising:
   a case body having a vent hole and a positioning accommodation trough, wherein the positioning accommodation trough corresponds to the vent hole, and a bottom of the positioning accommodation trough is in communication with the vent hole;
   a micro pump disposed in the positioning accommodation trough, wherein the micro pump corresponds to the vent hole in communication with the bottom of the positioning accommodation trough, whereby gas transmitted by the micro pump is discharged out through the vent hole during operation; and
   a heat dissipation tube plate having cooling fluid inside, wherein one end of the heat dissipation tube plate is fixed on the positioning accommodation trough and contacts a heating element of the mobile device so as to perform liquid convective heat exchange with heat generated by the heating element;
   wherein the gas transmitted by the micro pump forms gas flow so as to perform heat exchange with heat absorbed by the heat dissipation tube plate, and the gas flow is discharged out through the vent hole; and
   wherein the heat-dissipating component further comprises a liquid pump, wherein the liquid pump is in communication with an inside of the heat dissipation tube plate, whereby the cooling fluid inside the heat dissipation tube plate is capable of being pumped and circulating so that heat exchange effect of the heat dissipation tube plate is accelerated.

2. The heat-dissipating component according to claim 1, wherein the micro pump comprises:
   a nozzle plate comprising a plurality of connecting elements, a suspension sheet, and a hollow hole, wherein the suspension sheet is capable of bending and vibrating, the plurality of connecting elements is connected to a periphery of the suspension sheet, and the hollow hole is formed at a center portion of the suspension sheet, wherein the suspension sheet is fixed by the plurality of connecting elements, and the plurality of connecting elements provides the suspension sheet with a flexible support, wherein a gas flow chamber is formed under the nozzle plate, and at least one gap is formed among the plurality of connecting elements and the suspension sheet;
   a chamber frame stacked on the suspension sheet;
   an actuator stacked on the chamber frame so as to be bent to vibrate reciprocatingly when the actuator is applied with a voltage;
   an insulation frame stacked on the actuator; and
   a conductive frame stacked on the insulation frame;
   wherein a resonance chamber is formed among the actuator, the chamber frame, and the suspension sheet, wherein the actuator is driven to move the nozzle plate owing to a resonance effect, and the suspension sheet of the nozzle plate is bent to vibrate reciprocatingly, thereby making the gas flow through the at least one gap, enter into the gas flow chamber and then be discharged out, so as to achieve transmission of the gas.

3. The heat-dissipating component according to claim 2, wherein the actuator comprises:
   a piezoelectric carrier plate stacked on the chamber frame;
   an adjusting resonance plate stacked on the piezoelectric carrier plate; and
   a piezoelectric plate stacked on the adjusting resonance plate so as to drive the piezoelectric carrier plate and the adjusting resonance plate to bend and vibrate reciprocatingly when the piezoelectric plate is applied with a voltage.

4. The heat-dissipating component according to claim 1, wherein the micro pump comprises:
   an inlet plate having at least one inlet hole, at least one convergence trough corresponding to the at least one inlet hole, and a convergence chamber, wherein the at least one inlet hole is configured to guide a gas outside the micro pump to flow therein, and the at least one convergence trough is configured to guide the gas guided from the at least one inlet hole to be converged at the convergence chamber;
   a resonance sheet having a perforation corresponding to the convergence chamber, wherein a periphery of the perforation is a movable portion; and
   a piezoelectric actuator disposed correspondingly to the resonance sheet;
   wherein the inlet plate, the resonance sheet and the piezoelectric actuator are arranged sequentially and stacked with each other, wherein a chamber space is formed between the resonance sheet and the piezoelectric actuator, so that when the piezoelectric actuator is driven, the gas outside the micro pump is guided into the micro pump through the at least one inlet hole of the inlet plate, is converged at the convergence chamber via the at least one convergence trough, and flows through the perforation of the resonance sheet, thereby allowing the movable portion of the resonance sheet to resonate with the piezoelectric actuator so as to transmit the gas.

5. The heat-dissipating component according to claim 4, wherein the piezoelectric actuator comprises:
   a suspension plate having a square shape, wherein the suspension plate is capable of bending and vibrating;
   an outer frame disposed around a periphery of the suspension plate;

at least one supporting element connected between the suspension plate and the outer frame to provide a flexible support for the suspension plate; and a piezoelectric element having a side length, wherein the side length of the piezoelectric element is smaller than or equal to a side length of the suspension plate, and the piezoelectric element is attached to a surface of the suspension plate so as to drive the suspension plate to bend and vibrate when the piezoelectric element is applied with a voltage.

6. The heat-dissipating component according to claim 4, wherein the micro pump comprises:

a suspension plate having a first surface and a second surface, wherein the first surface has a protruding portion;

an outer frame disposed around a periphery of the suspension plate;

at least one supporting element connected between the suspension plate and the outer frame to provide a flexible support for the suspension plate; and a piezoelectric element attached to the second surface of the suspension plate so as to apply a voltage to the suspension plate to drive the suspension plate to bend and vibrate;

wherein the at least one supporting element is formed between the suspension plate and the outer frame, and the suspension plate and the outer frame are not coplanar, and wherein a chamber space is kept between the first surface of the suspension plate and the resonance sheet.

7. The heat-dissipating component according to claim 4, wherein the micro pump further comprises a first insulation sheet, a conductive sheet, and a second insulation sheet, wherein the inlet plate, the resonance sheet, the piezoelectric actuator, the first insulation sheet, the conductive sheet, and the second insulation sheet are sequentially stacked and assembled with each other.

8. The heat-dissipating component according to claim 1, wherein the micro pump is a micro-electromechanical systems (MEMS) pump and comprises:

a first substrate having a plurality of inlets, wherein each of the plurality of inlets is a conical hole;

a first oxide layer stacked on the first substrate, wherein the first oxide layer has a plurality of convergence channels and a convergence chamber, wherein the plurality of convergence channels is in communication between the convergence chamber and the plurality of inlets;

a second substrate combined with the first substrate, comprising:
a silicon wafer layer, having:
an actuation portion being in a circular shape;
an outer peripheral portion being in a hollow ring shape and surrounding a periphery of the actuation portion;
a plurality of connection portions respectively connected between the actuation portion and the outer peripheral portion; and
a plurality of fluid channels surrounding the periphery of the actuation portion and locates between the plurality of connection portions;
a second oxide layer formed on the silicon wafer layer, wherein the second oxide layer is in a hollow ring shape, and the second oxide layer and the silicon wafer layer together define a vibration chamber; and a silicon material layer being in a circular shape, located at the second oxide layer, and combined with the first oxide layer, wherein the silicon material layer comprising:
a through hole located at a center portion of the silicon material layer;
a vibration portion located at a peripheral area of the through hole; and
a fixed portion located at a peripheral area of the silicon material layer; and
a piezoelectric component being in a circular shape and stacked on the actuation portion of the silicon wafer layer.

9. The heat-dissipating component according to claim 8, wherein the piezoelectric element comprises:

a lower electrode layer;
a piezoelectric layer stacked on the lower electrode layer;
an insulation layer disposed on a part of a surface of the piezoelectric layer and a part of a surface of the lower electrode layer; and
an upper electrode layer stacked on the insulation layer and a remaining portion of the surface of the piezoelectric layer where the insulation layer is not disposed, wherein the upper electrode layer is used for electrically connecting to the piezoelectric layer.

10. The heat-dissipating component according to claim 1, wherein the liquid pump comprises:

a valve cover having a valve cover first surface, a valve cover second surface, an outlet channel, an inlet channel, and a plurality of latches, wherein the inlet channel and the outlet channel respectively penetrates the valve cover from the valve cover first surface to the valve cover second surface; wherein an inlet convex structure is formed on the valve cover second surface and surrounds an outer edge of the inlet channel, and a first protruding structure is disposed on the inlet convex structure; wherein an outlet convex structure is formed on the valve cover second surface and surrounds an outer edge of the outlet channel, and a center portion of the outlet convex structure is recessed to form an outlet chamber, and wherein the plurality of the latches protrudes out from the valve cover second surface;

two sets of valve sheets comprising a first valve sheet and a second valve sheet, wherein the first valve sheet and the second valve sheet respectively have a central valve sheet, and a plurality of extending supporting elements is disposed around a periphery of each of the central valve sheets for providing a flexible support, and a hollow through hole is formed between each two adjacent extending supporting elements of the extending supporting elements;

a valve base connected to the valve cover, wherein the first valve sheet and the second valve sheet are respectively disposed between the valve base and the valve cover; wherein the valve base has a valve base first surface, a valve base second surface, an inlet valve channel, and an outlet valve channel, wherein the inlet valve channel and the outlet valve channel respectively penetrate the valve base from the valve base first surface to the valve base second surface, wherein the inlet valve channel is recessed at an inner edge of the valve base first surface to form an inlet concave structure for being connected to the inlet convex structure of the valve cover, wherein the first valve sheet is disposed between the inlet concave structure and the inlet convex structure, so that the central valve sheet of the first valve sheet contacts against the first protruding structure of the valve cover to close the inlet channel of the valve cover, and a center portion of the inlet concave structure is recessed to form an inlet chamber; wherein the outlet valve channel is recessed at an inner edge of the valve base first surface to form an outlet concave structure, and a second protruding structure is disposed at a center portion of the outlet concave structure; wherein the outlet concave structure is connected to the outlet convex structure of the valve cover, and the second valve sheet is disposed between the outlet concave structure and the outlet convex structure, so that the central valve sheet of the second valve sheet contacts against the second protruding structure so as to close the outlet valve channel of the cover base; wherein a plurality of latch grooves is disposed on the valve base first surface corresponding to positions of the plurality of the latches on the valve cover so that the valve base is connected to the valve cover to enclose the first valve sheet and the second valve sheet, thereby achieving assembling and positioning, and wherein the valve base second surface is recessed to form a flow convergence chamber in communication with the inlet valve channel and the outlet valve channel;

an actuating device comprising a vibration sheet and a piezoelectric element, wherein the piezoelectric element is attached to one side of the vibration sheet, and the vibration sheet has a conducting pin, and wherein the vibration sheet covers the valve base second surface of the valve base so as to close the flow convergence chamber;

an outer barrel having a recessed space, wherein a bottom of the recessed space has a hollowed central trough and a penetration opening, wherein the penetration opening penetrates a side wall of the outer barrel and thus is in communication with outside; wherein the actuating device, the valve base, the two sets of the valve sheets, and the valve cover are sequentially arranged and placed in the recessed space, and the conducting pin of the actuating device is disposed in and penetrates through the penetration opening, and wherein a sealing glue is filled into the recessed space for fixing components in the recessed space, and wherein the piezoelectric element of the actuating device is disposed correspondingly in the central trough, whereby the piezoelectric element is capable of vibrating when being driven;

wherein the inlet channel of the valve cover corresponds to the inlet chamber of the valve base, and communication between the inlet channel and the inlet chamber is controlled by the first valve sheet, and wherein the outlet chamber of the valve cover corresponds to the outlet valve channel of the valve base, and communication between the outlet valve channel and the outlet chamber is controlled by the second valve sheet.

11. The heat-dissipating component according to claim 10, wherein the first protruding structure of the valve cover contacts against the central valve sheet of the first valve sheet to generate a perforce, thereby closing the inlet channel of the valve cover and preventing backflow.

12. The heat-dissipating component according to claim 10, wherein the second protruding structure of the valve base contacts against the central valve sheet of the second valve sheet to generate a perforce, thereby closing the outlet valve channel of the valve base and preventing backflow.

13. The heat-dissipating component according to claim 10, wherein when the piezoelectric element of the actuating device vibrates and moves downwardly, a pressure in the inlet chamber of the valve base becomes negative and thus attractive force is formed in the inlet chamber to pull the central valve sheet of the first valve sheet away and open the inlet channel of the valve cover, so that the cooling fluid is guided to flow into the liquid pump from the inlet channel of the valve cover, via the hollow through hole of the first valve sheet, enters into the inlet chamber of the valve base, and converged at the flow convergence chamber;

wherein when the piezoelectric element of the actuating device vibrates and moves upwardly, the cooling fluid in the flow convergence chamber is pushed toward the outlet valve channel of the valve base, so that the central valve sheet of the second valve sheet is pushed to move away and not contact the second protruding structure, whereby the cooling fluid passes through the hollow through hole of the second valve sheet, enters the outlet chamber of the valve cover, and is discharged out of the liquid pump through the outlet channel to complete transmission of the cooling fluid.

* * * * *